United States Patent
Dehe

(10) Patent No.: US 9,024,396 B2
(45) Date of Patent: May 5, 2015

(54) DEVICE WITH MEMS STRUCTURE AND VENTILATION PATH IN SUPPORT STRUCTURE

(71) Applicant: Infineon Technologies AG, Neubiberg (DE)

(72) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/941,318

(22) Filed: Jul. 12, 2013

(65) Prior Publication Data

US 2015/0014796 A1    Jan. 15, 2015

(51) Int. Cl.
*H01L 29/84*    (2006.01)
*B81B 3/00*    (2006.01)

(52) U.S. Cl.
CPC ............ *B81B 3/0021* (2013.01); *B81B 3/0094* (2013.01)

(58) Field of Classification Search
CPC .... B91B 3/0021; B81B 3/0021; B81B 3/0094
USPC ........................................................ 257/416
See application file for complete search history.

(56) References Cited

U.S. PATENT DOCUMENTS

| | | |
|---|---|---|
| 5,146,435 A | 9/1992 | Bernstein |
| 5,452,268 A | 9/1995 | Bernstein |
| 6,075,867 A | 6/2000 | Bay et al. |
| 6,160,896 A | 12/2000 | Macaluso et al. |
| 6,549,635 B1 | 4/2003 | Gebert |
| 7,570,772 B2 | 8/2009 | Sorensen et al. |
| 8,039,911 B2 * | 10/2011 | Nakatani et al. .............. 257/416 |
| 8,447,057 B2 * | 5/2013 | Goida et al. ................... 381/361 |
| 2004/0259286 A1 | 12/2004 | Dehe et al. |
| 2005/0179100 A1 | 8/2005 | Barzen et al. |
| 2005/0185812 A1 | 8/2005 | Minervini |
| 2005/0207605 A1 | 9/2005 | Dehe et al. |
| 2005/0241944 A1 | 11/2005 | Dehe et al. |
| 2005/0262947 A1 | 12/2005 | Dehe |
| 2007/0034976 A1 | 2/2007 | Barzen et al. |
| 2008/0104825 A1 | 5/2008 | Dehe et al. |
| 2008/0247573 A1 * | 10/2008 | Pedersen ....................... 381/174 |
| 2009/0162534 A1 | 6/2009 | Dehe et al. |
| 2009/0309174 A1 | 12/2009 | Fueldner et al. |
| 2010/0158281 A1 | 6/2010 | Lee et al. |
| 2010/0164025 A1 | 7/2010 | Yang |
| 2011/0127623 A1 | 6/2011 | Fueldner et al. |
| 2011/0144415 A1 | 6/2011 | Hellmuth et al. |
| 2011/0156176 A1 | 6/2011 | Huckabee et al. |
| 2011/0170735 A1 | 7/2011 | Dehe et al. |
| 2011/0272769 A1 | 11/2011 | Song et al. |
| 2013/0243234 A1 * | 9/2013 | Zoellin et al. ................. 381/369 |
| 2014/0084396 A1 * | 3/2014 | Jenkins et al. ................ 257/419 |

* cited by examiner

*Primary Examiner* — William D Coleman
(74) *Attorney, Agent, or Firm* — Slater & Matsil, L.L.P.

(57) ABSTRACT

A device includes a support structure, a sound port disposed in the support structure, and a MEMS structure including a membrane acoustically coupled to the sound port. The membrane separates a first space contacting a first side of the membrane from a second space contacting an opposite second side of the membrane. The device further includes an adjustable ventilation path disposed in the support structure and extending from the sound port to the second space.

26 Claims, 22 Drawing Sheets

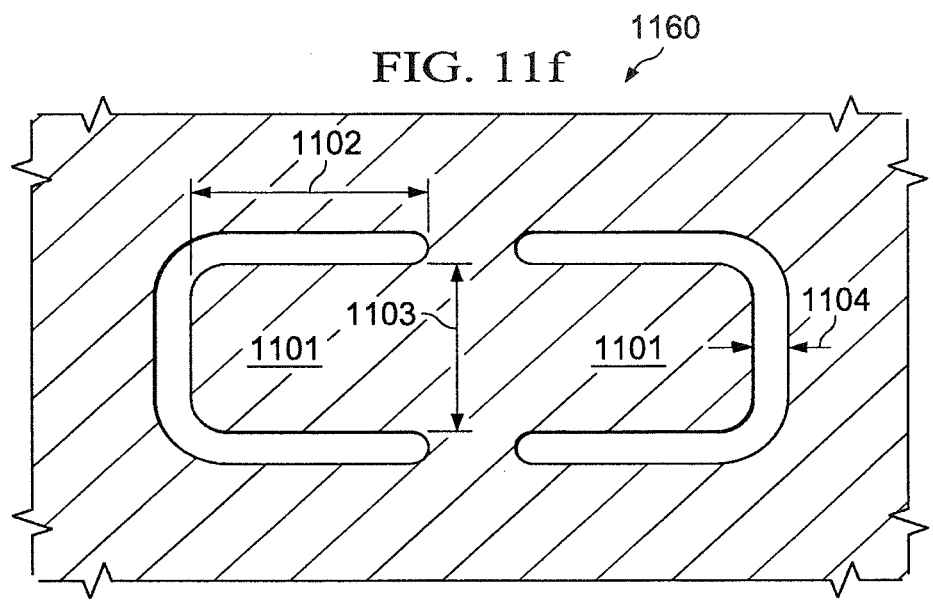
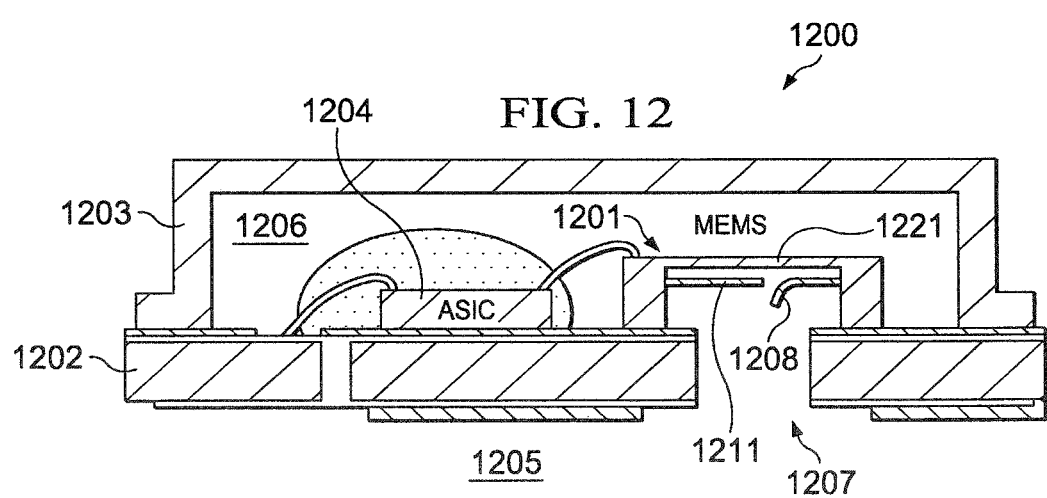

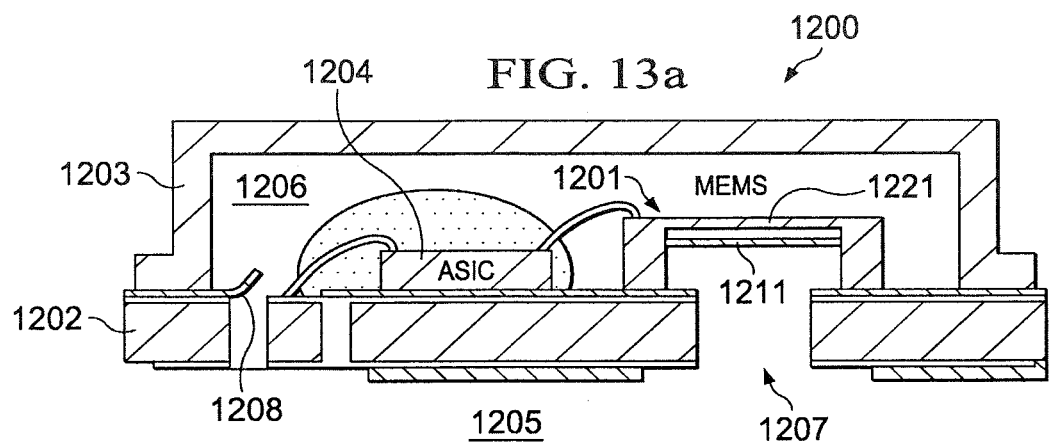
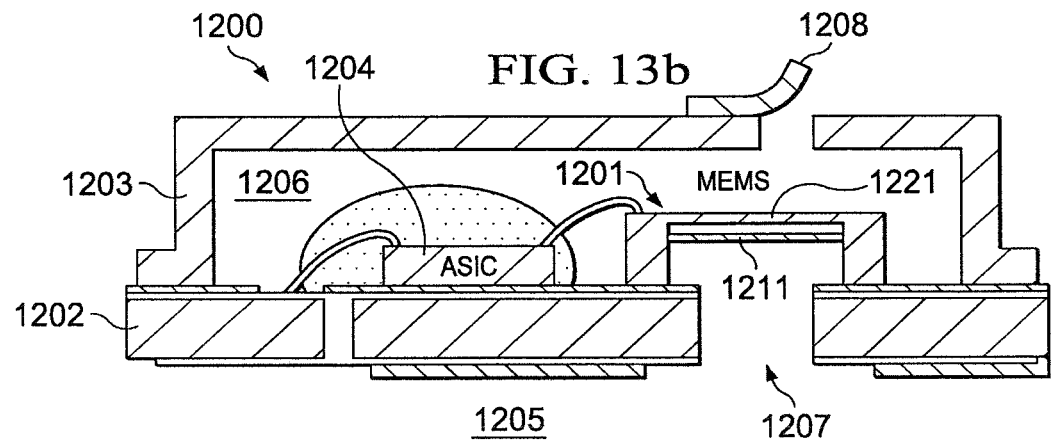
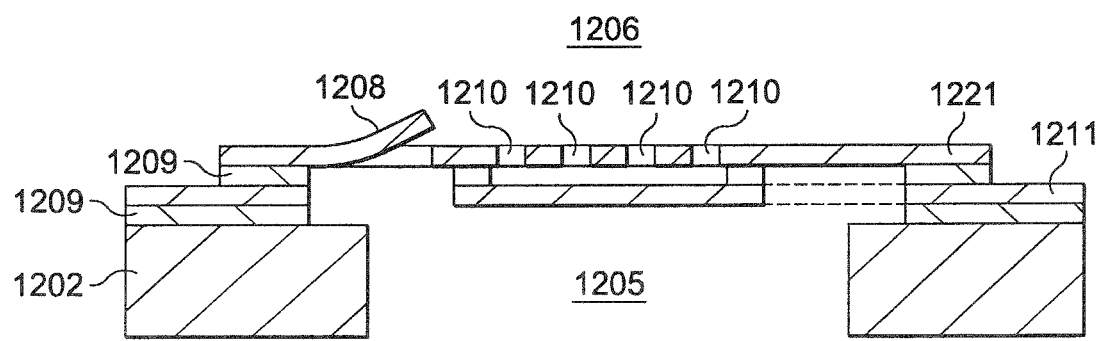

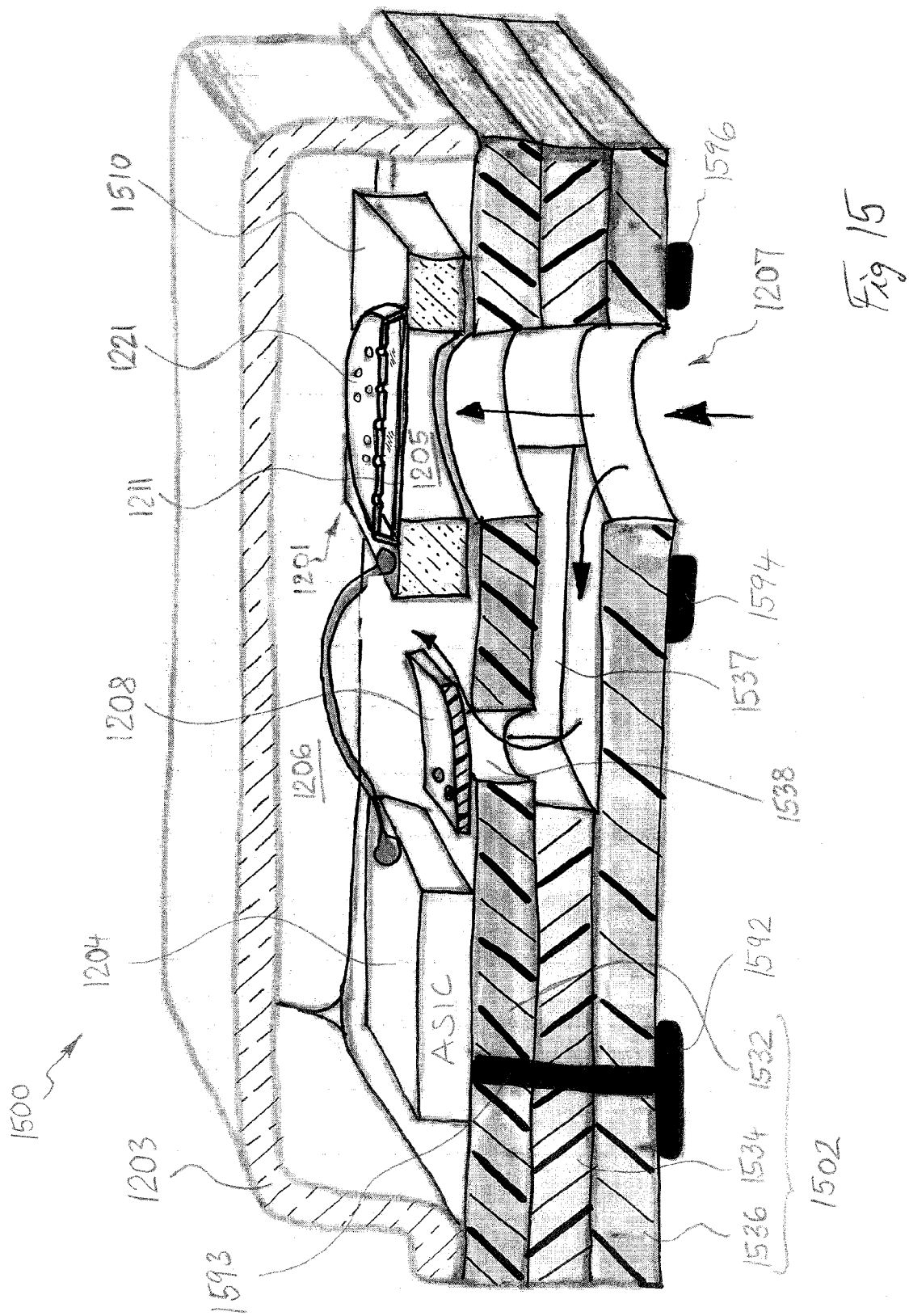

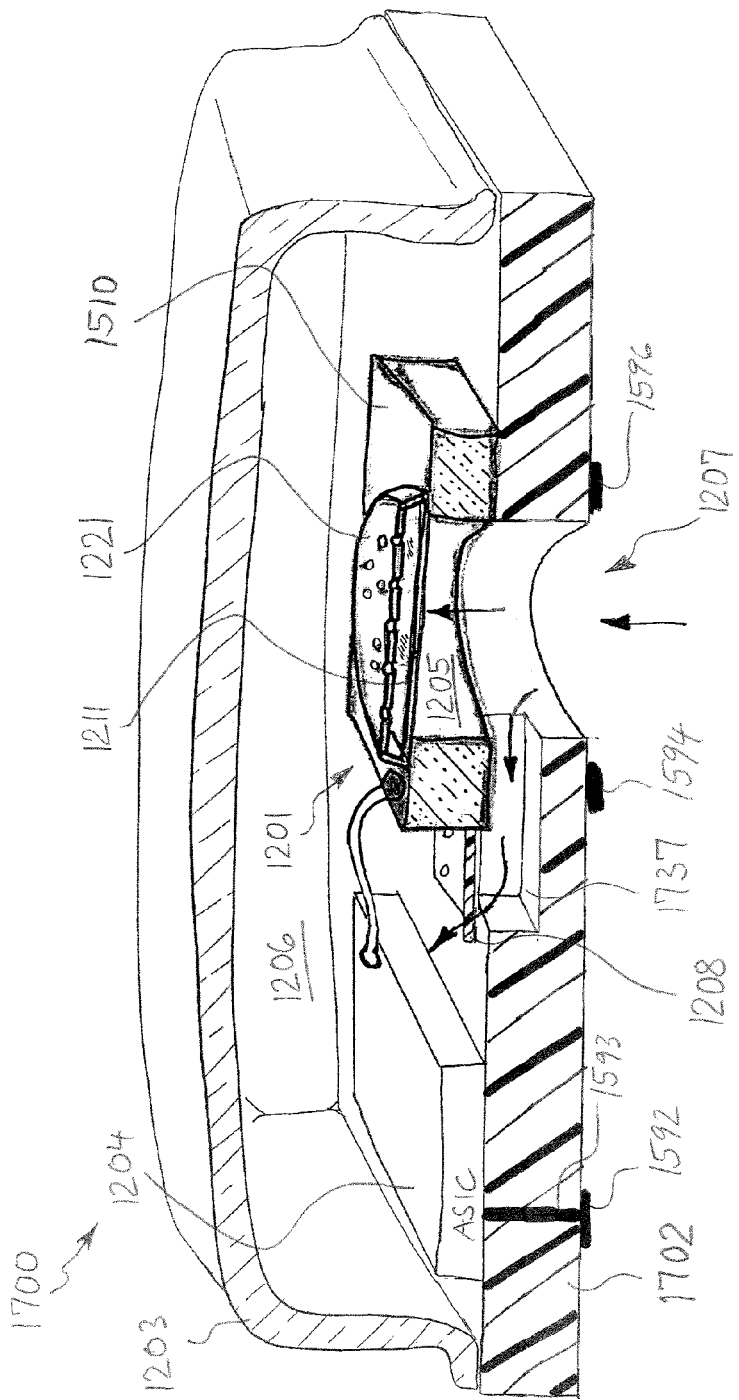

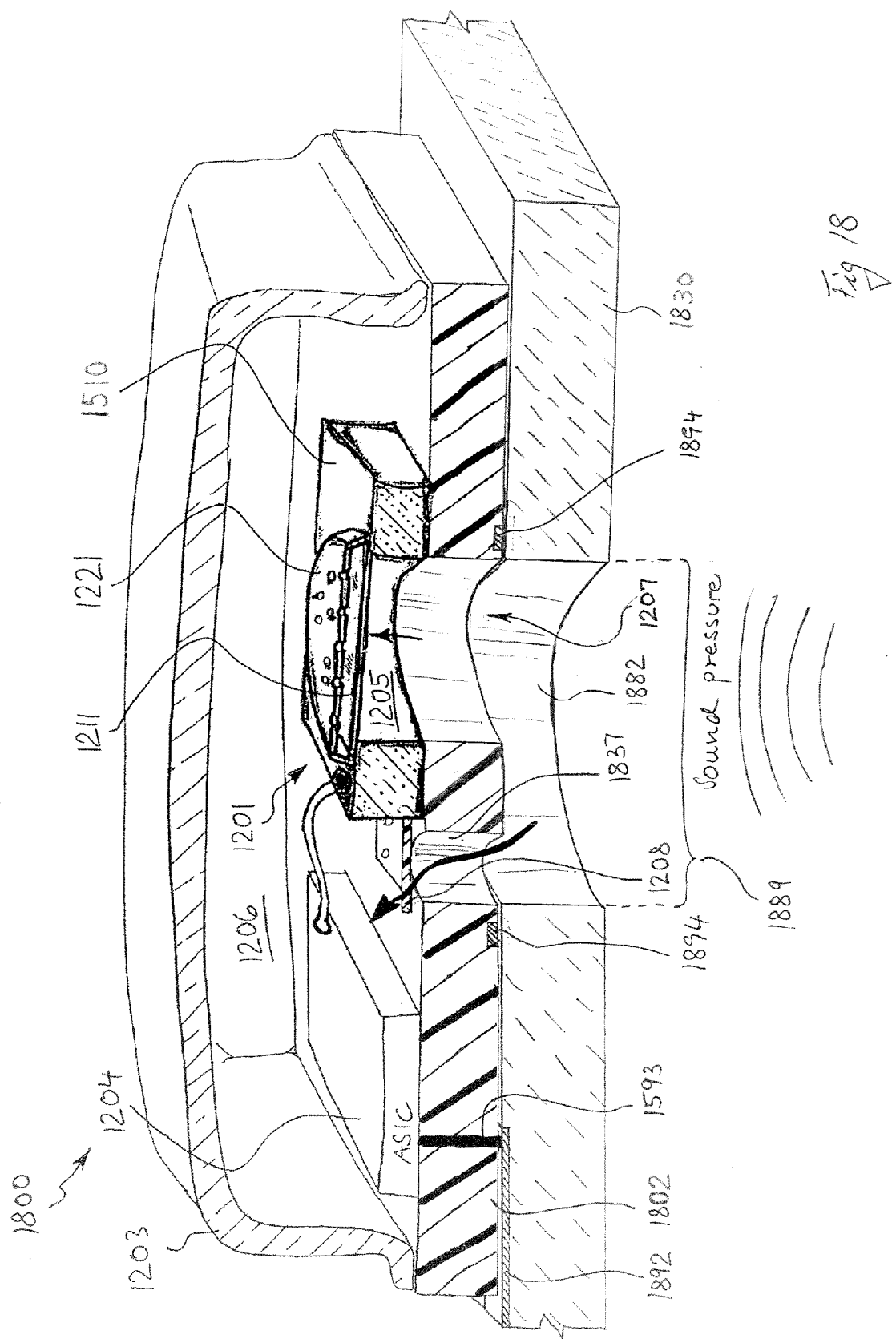

DEVICE WITH MEMS STRUCTURE AND VENTILATION PATH IN SUPPORT STRUCTURE

TECHNICAL FIELD

The present invention relates generally to a ventilation path in a device comprising a MEMS structure.

BACKGROUND

In general, microphones may be manufactured in large numbers at low cost. Due to these requirements, microphones may be produced in silicon technology. Microphones may be produced with different configurations for their different field of applications. In one example, microphones may measure the change in capacitance by measuring the deformation or deflection of the membrane relative to a counter electrode, for example. The microphone may be typically operated by setting a bias voltage to an appropriate value.

A microphone may have operation and other parameters such as signal-to-noise ratio (SNR), rigidity of the membrane or counter electrode, or diameter of the membrane which often may be set by the manufacturing process. In addition, a microphone may have different characteristics based on different materials used in the manufacturing process.

SUMMARY OF THE INVENTION

In accordance with an embodiment of the present invention, a device may comprise a MEMS structure with a support structure, a substrate mechanically connected to the support structure, and a membrane mechanically connected to the substrate. The membrane may separate a first space contacting a first side of the membrane and a second space contacting an opposite second side of the membrane. The device may further comprise a sound port acoustically coupled to the membrane at the first side of the membrane, the sound port being formed in the support structure and the substrate. The MEMS structure may further comprise a ventilation path through the support structure extending from the sound port to the second space.

In accordance with another embodiment of the present invention, a device may comprise a MEMS structure comprising a substrate and a membrane that may be mechanically connected to the substrate, the membrane separating a first space contacting a first side of the membrane from a second space contacting an opposite second side of the membrane. The device may further comprise a housing enclosing the MEMS structure and a sound port formed in the housing, the sound port being acoustically coupled to the first space. The device may further comprise a ventilation path through the housing extending from between the sound port to the second space.

BRIEF DESCRIPTION OF THE DRAWINGS

For a more complete understanding of the present invention, and the advantages thereof, reference is now made to the following descriptions taken in conjunction with the accompanying drawings, in which:

FIG. 5b shows a top-view of the MEMS structure of FIG. 5a;

FIG. 7c shows a top-view of the MEMS structure of FIG. 7a;

FIGS. 11a-11f each show a top view of an adjustable ventilation opening;

FIG. 12 shows a front view of a MEMS structure or device comprising a device housing, wherein an adjustable ventilation opening is located on a membrane;

FIG. 13a shows a front view of a MEMS structure or device comprising a device housing, wherein an adjustable ventilation opening is located on a support structure;

FIG. 13b shows a front view of a MEMS structure or device comprising a device housing, wherein an adjustable ventilation opening is located on a lid;

FIG. 13c shows a cross-section view of a MEMS structure, wherein an adjustable ventilation opening is located on a backplate;

FIG. 15 shows an embodiment of the present invention comprising a ventilation path through the support structure connecting the sound port with the space at the opposite side of the membrane;

FIG. 17 shows another embodiment of the present invention similar to FIG. 15, wherein the support structure has a single layer and the ventilation path is formed as a recess in the support structure; and FIG. 18 shows another embodiment of the present invention similar to FIG. 15, wherein the sound port and the ventilation path both extend from a sound hole formed in the application layer structure, e.g., a mobile phone.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures such as pressure sensors, RF MEMS, accelerometers, and actuators. Additionally, the specific embodiments will primarily presuppose air as the medium in which pressure waves propagate. The invention, however, is in no way limited to air and will have applications in many media.

Microphones may be realized as parallel plate capacitors on a chip. The chip may be packaged enclosing a given back-volume. A movable membrane may vibrate due to pressure differences such as differences caused by acoustic signals. The membrane displacement may be translated into an electrical signal using capacitive sensing.

Figure 1A:
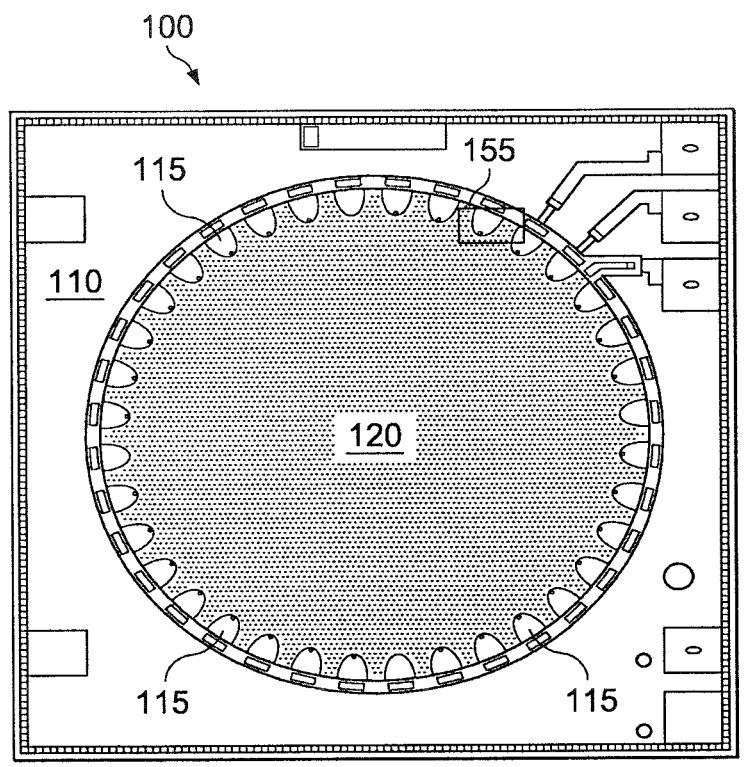
FIG. 1a shows a top view of a MEMS structure.
Figure 1B:
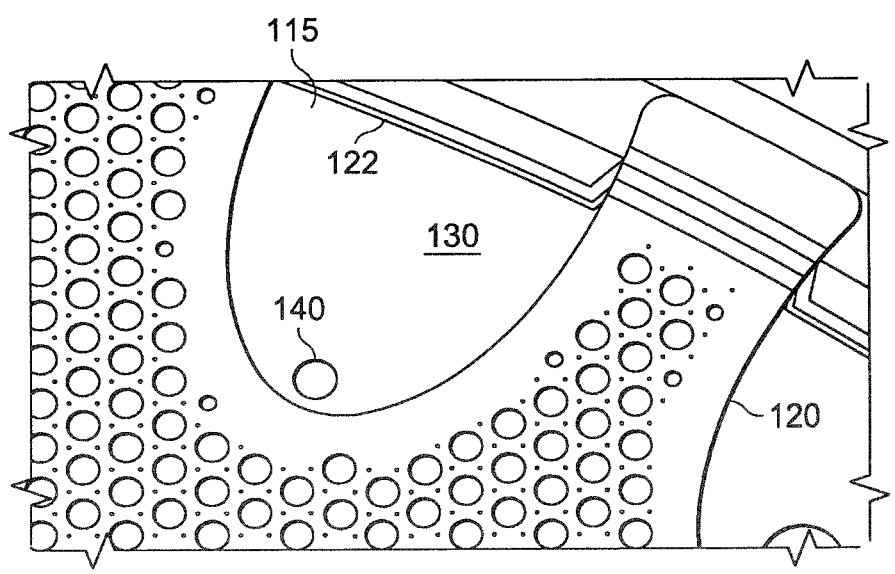
FIG. 1b shows a detailed perspective view of a connection region of a MEMS structure.
Figure 1C:
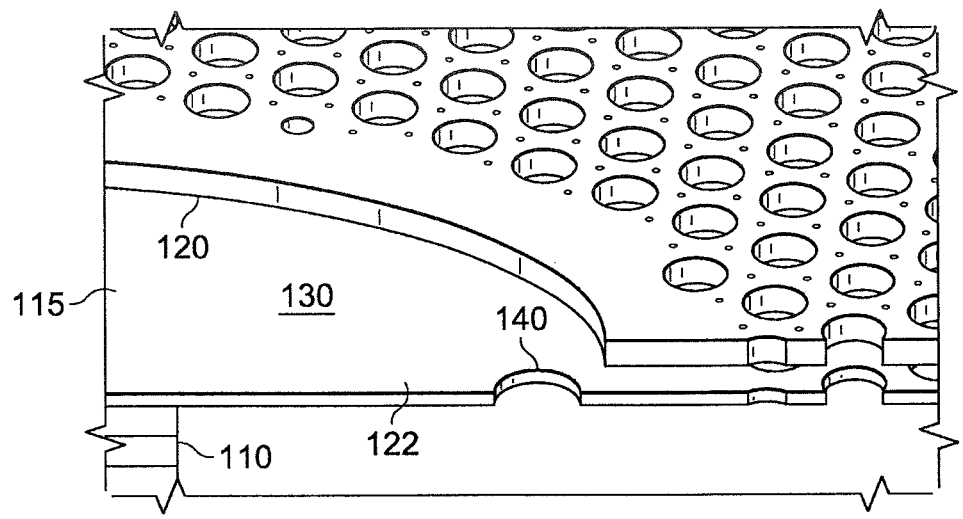
FIG. 1c shows a cross-sectional view of a connection region of a MEMS structure.

FIG. 1a shows a top view of a MEMS device 100. A backplate or counter electrode 120 and a movable electrode or membrane 130 may be connected via connection regions 115 to the substrate 110. FIGS. 1b and 1c show detailed perspective views of one connection regions 115 of the MEMS device 100. FIG. 1b shows a top view of the cutout 155 from FIG. 1a and FIG. 1c shows a cross-section view of the same region. A backplate or counter electrode 120 may be arranged over a membrane or movable electrode 130. The backplate 120 may be perforated to avoid or mitigate damping. The membrane 130 may comprise a ventilation hole 140 for low frequency pressure equalization. In view of the adjustable ventilation holes discussed herein, the ventilation hole 140 is optional and may or may not be included with the various embodiments discussed herein.

In FIGS. 1a-1c, the membrane 130 may be mechanically connected to the substrate 110 in the connection regions 115. In these regions 115 the membrane 130 typically cannot move. The backplate 120 may be also mechanically connected to the substrate 110 in the connection region 115. The substrate 110 may form a rim 122 to provide space for the back-volume. The membrane 130 and the backplate 120 may be connected to the substrate at or close to the rim 122. The rim 122 and the membrane 130 may form a circle. Alternatively, the rim 122 and the membrane 130 may comprise a square or may comprise any other suitable geometrical form.

In general, designing and manufacturing a sensor may require a high signal-to-noise ratio (SNR). Among other things, this might be achieved when the change in capacitance to be measured is as great as possible and when the parasitic capacitance is as small as possible. Typically, the greater the parasitic portion of the capacitance is relative to the overall capacitance, the smaller the SNR.

The compliance of the back-volume and the resistance of the ventilation path through the ventilation hole may define the mechanical RC constant of the sensor. If the ventilation hole is large or if multiple holes are used, the corner frequency may be a relatively high frequency and if the ventilation hole is small, the corner frequency may be a relatively lower frequency. Both back-volume and the diameter and number of the ventilation holes may be given by construction and hence the corner frequency may be given by construction. Accordingly, it might not be possible to change the corner frequency during operation if only a fixed ventilation hole is provided.

A problem with a fixed size ventilation hole may be that high energetic signals that have a frequency above the corner frequency of the ventilation hole may distort or overdrive the sensor even with the application of electrical filters. Moreover, if a sensor is used for more than one application, two sensors may have to be integrated into one sensor system, which doubles the system costs.

An embodiment of the invention may provide tunable ventilation openings in a MEMS structure. The tunable ventilation openings may be switched between an open position and a closed position. The tunable ventilation holes may also be set in an intermediate position. Another embodiment of the invention may provide a variable ventilation opening cross-section. An embodiment of the invention may provide a tunable ventilation opening in a sensing region close to a rim of the substrate. A further embodiment may provide a tunable ventilation opening in a tuning region outside the sensing region of the membrane. Another embodiment of the invention may provide a passively actuated adjustable ventilation opening located in the membrane, the backplate, a substrate, a support structure, a device housing, or a lid. These various embodiments can be implemented individually or in any combination, for example.

Figure 2A:
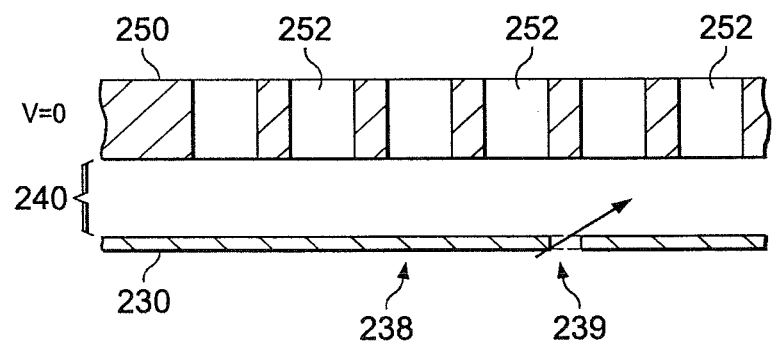
FIGS. 2a-2c show cross-sectional views of an adjustable ventilation opening.
Figure 2B:
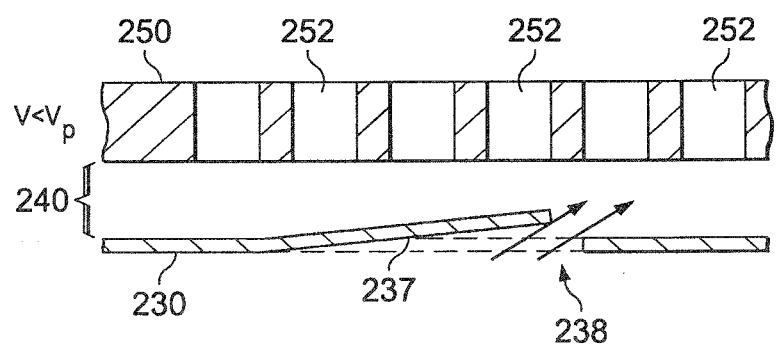
Figure 2C:
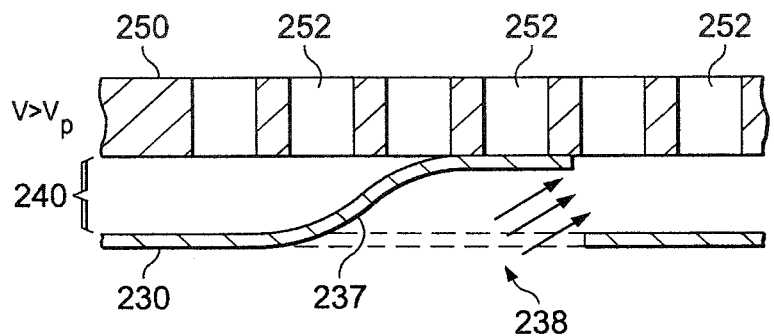
Figure 2D:
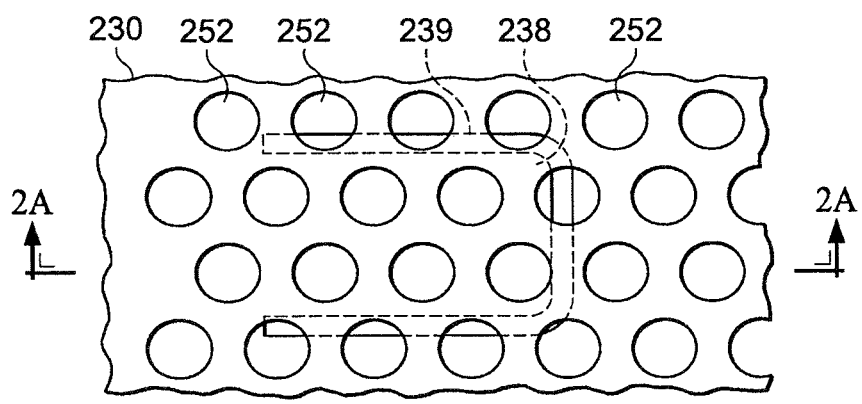
FIG. 2d shows a top view of an adjustable ventilation opening.

FIGS. 2a-2c show a cross sectional view of a backplate or counter-electrode 250 and a membrane or movable electrode 230 possibly having an air gap 240 between them. The backplate 250 may be perforated 252 and the membrane 230 comprises an adjustable ventilation opening 238. FIG. 2d shows a top view of this arrangement with the circles indicating the perforated back plate 250, 252 and dark plane being the underlying membrane 230. The movable portion 237 of the adjustable ventilation hole 238 may be formed as a U shaped slot 239. The adjustable ventilation opening 238 may comprise of rectangular, square or semicircle form. Alternatively, the adjustable ventilation opening 238 may comprise any geometrical form as long as the form is able to provide a ventilation path. The movable portion 237 of the adjustable ventilation opening 238 may be a cantilever, a bridge or a spring supported structure.

FIG. 2a shows a configuration where the actuation voltage (bias voltage) $V_{bias}=0$. The adjustable ventilation opening 238 may be closed forming a small slot 239 in the membrane 230. No actuation voltage provides a minimal ventilation path and therefore a low threshold frequency. The adjustable ventilation opening 238 may be in a closed or OFF (non-activated) position. An example of such a low threshold frequency can be seen as frequency "A" in FIG. 2e.

FIG. 2b shows a configuration where the actuation voltage $V_{bias}$ may be increased, i.e., may e different than 0 V but lower than the pull-in voltage $V_{pull-in}$. The adjustable ventilation opening 238 may open and provide a larger ventilation path than in the configuration of FIG. 2a. The threshold frequency can be seen as frequency "B" in FIG. 2e. It is noted that adjustable ventilation opening 238 may provide a sizable ventilation path when displacement of the movable portion 237 is larger than the thickness of the membrane 230.

FIG. 2c shows a configuration where the actuation voltage $V_{bias}$ may be larger than pull-in voltage $V_{pull-in}$. The adjustable ventilation opening 238 may be completely open and a large ventilation path may be created. The threshold frequency can be seen as frequency "C" in FIG. 2e. By adjusting the actuation voltage the RC constant can be decreased or increased and the threshold frequency can be set according to a desired value. It is noted that the adjustable ventilation opening may already open completely for actuation voltages below the pull-in voltage.

Figure 2E:
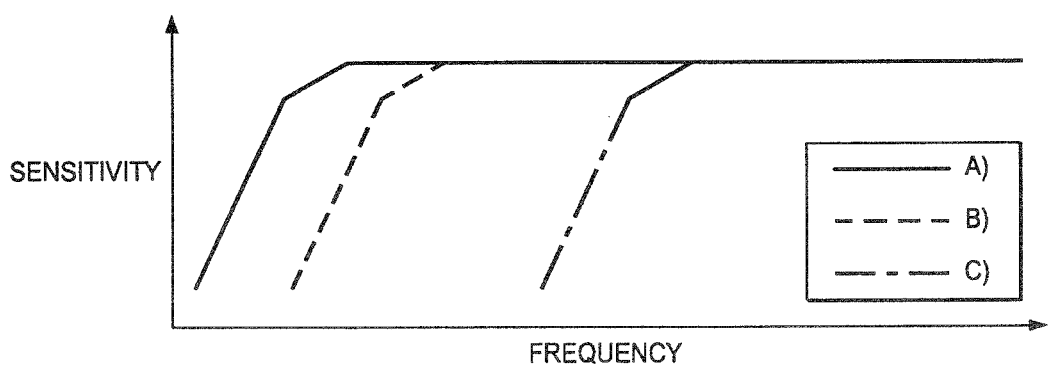
FIG. 2e shows a diagram for a corner or threshold frequency.

Referring now to FIG. 2e, in one example the threshold frequency "A" may be about 10-50 Hz and may be moved to about 200-500 Hz as threshold frequency "C." Alternatively, the threshold frequency in "A" may be about 10-20 Hz and may be moved to about 200-300 Hz in "C." In another example the threshold frequency "A" would be 10-100 Hz and may be changed to 500-2000 Hz in "C."

The threshold frequency in position "A" may also depend on the number of adjustable ventilation openings and the gap distance a slot forms in the membrane. The threshold frequency in position "A" may be higher for a MEMS structure with more adjustable ventilation openings (e.g., 32 adjustable ventilation openings) than for a MEMS structure with less adjustable ventilation openings (e.g., 2, 4 or 8 adjustable ventilation openings). The threshold frequency may be also higher for MEMS structures with a larger slot gap (larger slot width and/or larger slot length) defining the adjustable ventilation opening than for those with a smaller slot gap.

Figure 3A:
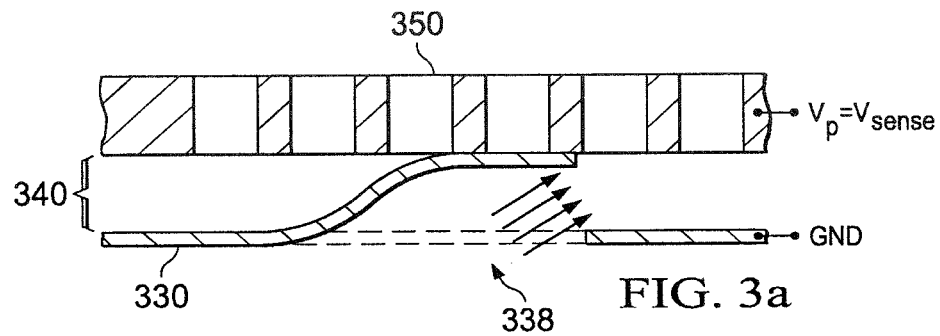
FIGS. 3a-3d show different configurations of an adjustable ventilation opening.

FIG. 3a shows a configuration of an actuation voltage (tuning or switching voltage) wherein the actuation voltage may be identical to the sensing bias. The MEMS structure may comprise a single electrode on the backplate 350, an air gap 340 and a membrane 330. The electrode of the backplate 350 may be set to an actuation potential and the membrane 330 may be set to ground. The adjustable ventilation opening 338 may be closed with a low actuation voltage (OFF position) and open with a high actuation voltage (ON position). A low actuation voltage may result in a low corner or threshold frequency and a low sensitivity of the MEMS structure, and a high actuation voltage may result in a high corner or threshold frequency and a high sensitivity.

Figure 3B:
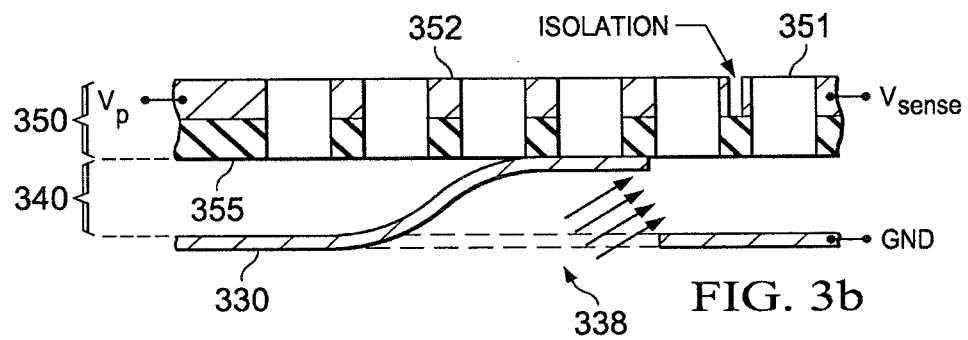

FIG. 3b shows a configuration wherein the actuation voltage (tuning or switching voltage) may be independent from the sensing bias. The MEMS structure may comprise a structured backplate 350, e.g., a backplate that has at least two electrodes, an air gap 340 and a membrane 330. The second electrode 352 of the backplate 350 may be set to an actuation potential and the first electrode 351 is set to a sense potential. The membrane 330 may be set to ground. The two electrodes may be isolated from each other. For example, the backplate 350 may comprise the structured electrode and an isolation support 355. The isolation support 355 may face toward the membrane 330 or may face away from the membrane 330. According to at least some embodiments, the tuning or switching voltage does not influence the sensitivity of the MEMS structure.

The adjustable ventilation opening may be 338 closed with a low actuation voltage (OFF position) and open with a high actuation voltage (ON position). A low actuation voltage may result in a low corner or threshold frequency and a high actuation voltage may result in a high corner or threshold frequency. The sense bias may be independent from the actuation voltage and can be kept constant or independently decreased or increased.

Figure 3C:
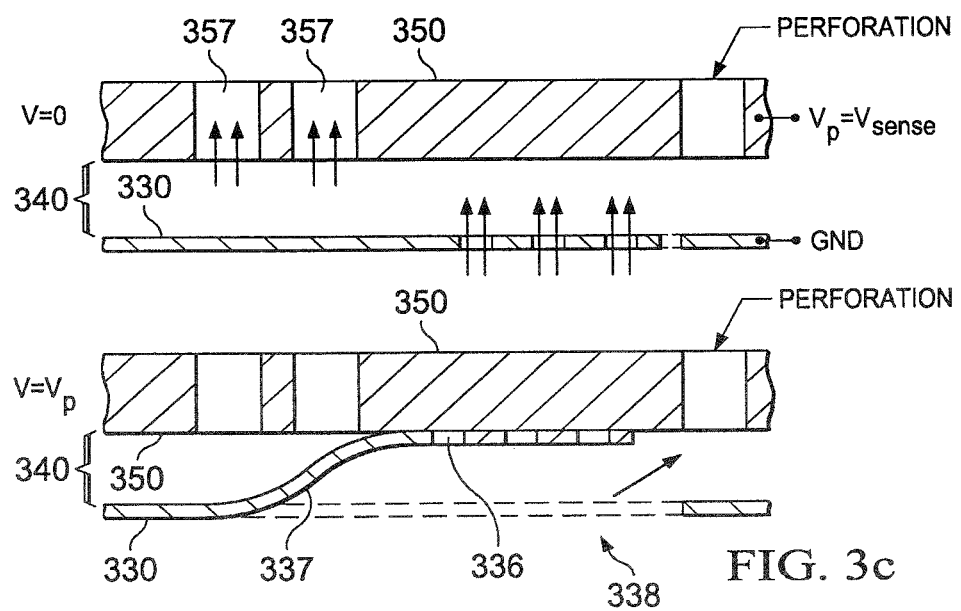

FIG. 3c shows a configuration of an actuation voltage (tuning or switching voltage) wherein the actuation voltage may be identical to the sensing bias. The MEMS structure may comprise a single electrode in the backplate 350, an air gap 340 and a membrane 330. The adjustable ventilation opening 338 may be closed with a high actuation voltage (ON position) and may be open with a low actuation voltage (OFF position). The movable portion 337 of the adjustable ventilation opening 338 may touch the backplate 350 when activated and may be in plane with the rest of the membrane when not activated. A low actuation voltage may result in a high corner or threshold frequency and a low sensitivity of the MEMS structure, and a high actuation voltage may result in low corner or threshold frequency and a high sensitivity of the MEMS structure. The backplate 350 may comprise ventilation openings 357 and the movable portion 337 of the adjustable ventilation opening 338 may comprise ventilation openings 336. The ventilation openings 336 in the movable portion 337 of the adjustable ventilation opening 338 may be closed in an ON (or activated) position. There may be a minor ventilation path through the adjustable ventilation opening 338 when the adjustable ventilation opening is in the ON (or activated) position.

Figure 3D:
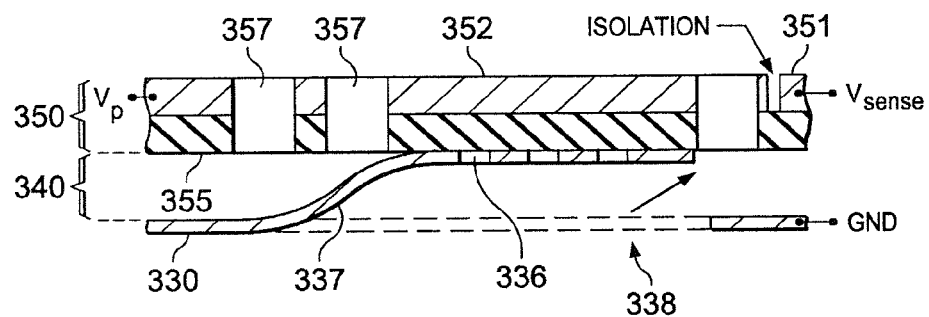

FIG. 3d shows the actuation voltage (tuning or switching voltage) wherein the actuation voltage may be independent from the sensing bias. This MEMS structure may comprise a structured backplate 350, e.g., the backplate may comprise a first electrode 351 and a second electrode 352, an air gap 340 and a membrane 330. Alternatively, the structured backplate 350 may comprise more than two electrodes. The second electrode 352 of the backplate 350 may be set to an actuation potential and the first electrode 351 is set to a sense potential. The membrane 330 may be set to ground. The first electrode 351 and the second electrode 352 may be isolated from each other. For example, the backplate 350 may comprise the structured electrode and an isolation support 355. The isolation support 355 may face toward the membrane 330 or may face away from the membrane 330. The tuning or switching voltage does typically not influence the sensitivity of the MEMS structure.

The adjustable ventilation opening may be closed with a high actuation voltage (ON position) and is open with a low actuation voltage (OFF position). A low actuation voltage (OFF position) may result in a high corner or threshold frequency and a high actuation voltage (ON position) may results in a low corner or threshold frequency. The sense bias may be independent from the actuation voltage and can be kept constant or independently decreased or increased.

The backplate 350 may comprise ventilation openings 357 and the movable portion 337 of the adjustable ventilation opening 338 may comprise also ventilation openings 336. The ventilation openings 336 in the adjustable ventilation opening 338 may be closed in the ON position. There may be a minor ventilation path through the ventilation openings 357 of the backplate 338 and the ventilation openings 336 of the adjustable ventilation opening 338 when the adjustable ventilation opening 338 is open. There may be a ventilation path through the ventilation openings 357 of the backplate 350 and the ventilation openings 336 of the adjustable ventilation opening 338 when the adjustable ventilation opening 338 is closed or in an OFF position.

Figure 4A:
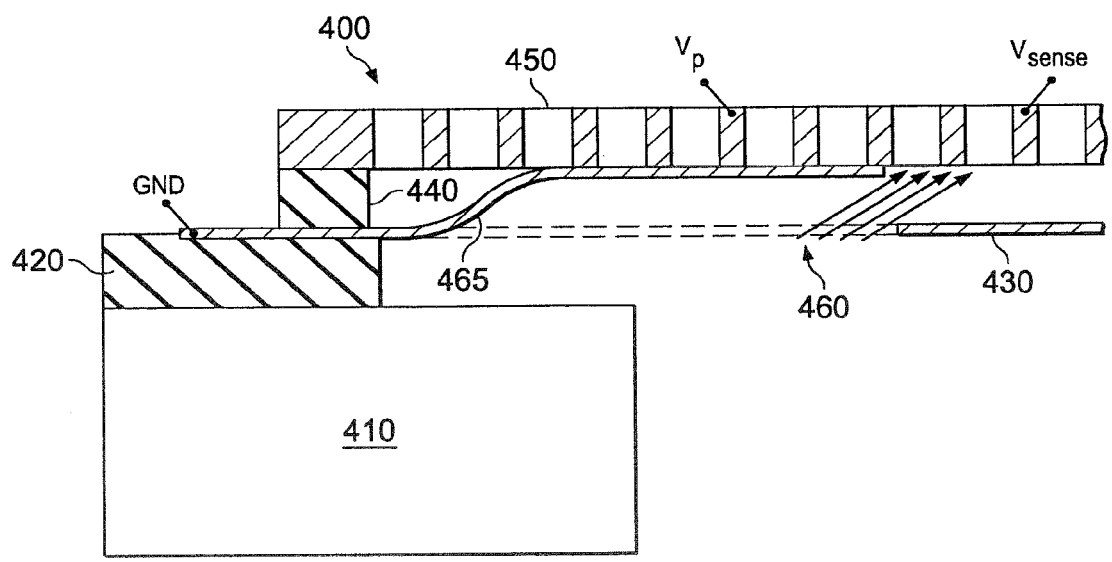
FIG. 4a shows a cross-sectional view of a MEMS structure, wherein the membrane is pulled toward the backplate.

FIG. 4a shows a cross-sectional view of a MEMS structure 400. The MEMS structure comprises a substrate 410. The substrate 410 may comprise silicon or other semiconductor materials. Alternatively, the substrate 410 may comprise compound semiconductors such as GaAs, InP, Si/Ge, or SiC, as examples. The substrate 410 may comprise single crystal silicon, amorphous silicon or polycrystalline silicon (polysilicon). The substrate 410 may include active components such as transistors, diodes, capacitors, amplifiers, filters or other electrical devices, or an integrated circuit. The MEMS structure 400 may be a stand-alone device or may be integrated with and IC into a single chip.

The MEMS structure 400 may further comprise a first insulating layer or spacer 420 disposed over the substrate 410. The insulating layer 420 may comprise an insulating material such a silicon dioxide, silicon nitride, or combinations thereof.

The MEMS structure 400 may further comprise a membrane 430. The membrane 430 may be a circular membrane or a square membrane. Alternatively, the membrane 430 may comprise other geometrical forms. The membrane 430 may comprise conductive material such as polysilicon, doped polysilicon or a metal. The membrane 430 may be disposed above the insulating layer 420. The membrane 430 may be physically connected to the substrate 410 in a region close to the rim of the substrate 410.

Moreover, the MEMS structure 400 may comprise a second insulating layer or spacer 440 disposed over a portion of the membrane 430. The second insulating layer 440 may comprise an insluting material such as a silicon dioxide, silicon nitride, or combinations thereof.

A backplate 450 may be arranged over the second insulating layer or spacer 440. The backplate 450 may comprise a conductive material such as polysilicon, doped polysilicon or a metal, e.g., aluminum. Moreover, the backplate 450 may comprise an insulating support or insulating layer regions. The insulating support may be arranged toward or away from the membrane 430. The insulating layer material may be silicon oxide, silicon nitride or combinations thereof. The backplate 450 may be perforated.

The membrane 430 may comprise at least one adjustable ventilation opening 460 as described above. The adjustable ventilation openings 460 may comprise a movable portion 465. In one example the adjustable ventilation openings 460 are located in a region close to the rim of the substrate 410. For example, the adjustable ventilation openings 460 may be located in the outer 20% of the radius of the membrane 430 or the outer 20% of the distance from a center point to the membrane 430 edge of a square or a rectangle. In particular, the adjustable ventilation openings 460 may not be located in a center region of the membrane 430. For example, the adjustable ventilation openings 460 may not be located in the inner 80% of the radius or the distance. The adjustable ventilation openings 460 may be located in equidistant distances from each other along a periphery of the membrane 430.

The example of FIG. 4a is configured so that the adjustable ventilation openings 460 open toward the backplate 450. The membrane 430 and the backplate 450 may have any of the configurations as described in FIGS. 2a-2d and 3a-3d. The backplate 450 may be set to a sense voltage $V_{sense}$ and an actuation voltage $V_p$ (sense voltage and actuation voltage can be the same or different as described above) and the membrane 430 is set to ground, or vice versa.

Figure 4B:
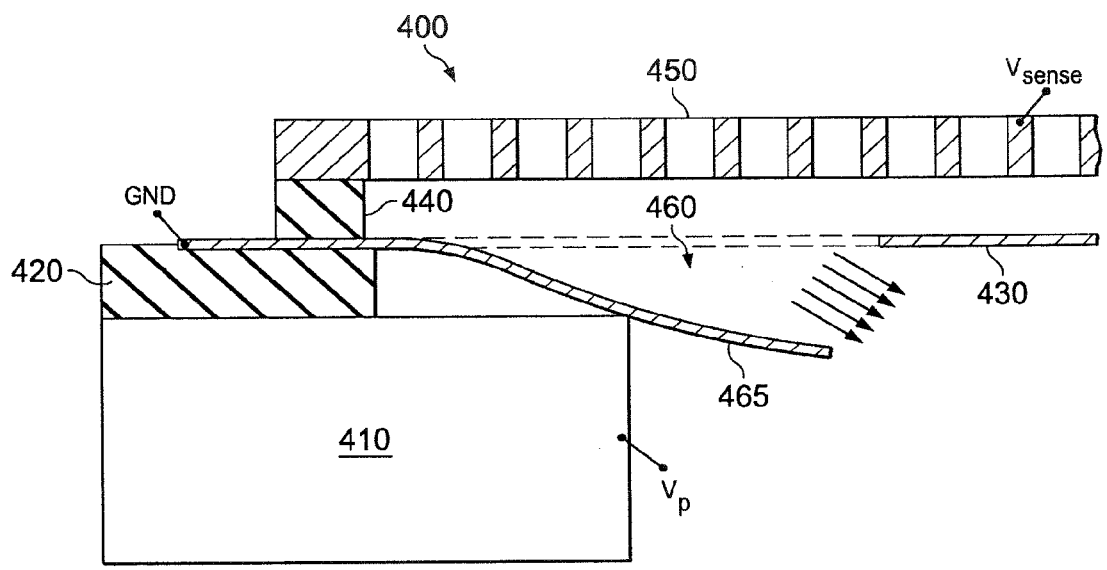
FIG. 4b shows a cross-sectional view of a MEMS structure, wherein the membrane is pulled toward the substrate.

The MEMS structure 400 of FIG. 4b shows a similar structure to that of FIG. 4a. However, the configuration is different, e.g., the movable portion 465 of the adjustable ventilation opening 460 is pulled toward the substrate 410. The backplate may be set to a sense voltage $V_{sense}$, the substrate may be set to the actuation voltage $V_p$ and the membrane may be set to ground. In this configuration of the MEMS structure 400 the actuation voltage (tuning or switching voltage) may be independent of the sensing voltage.

Figure 5A:
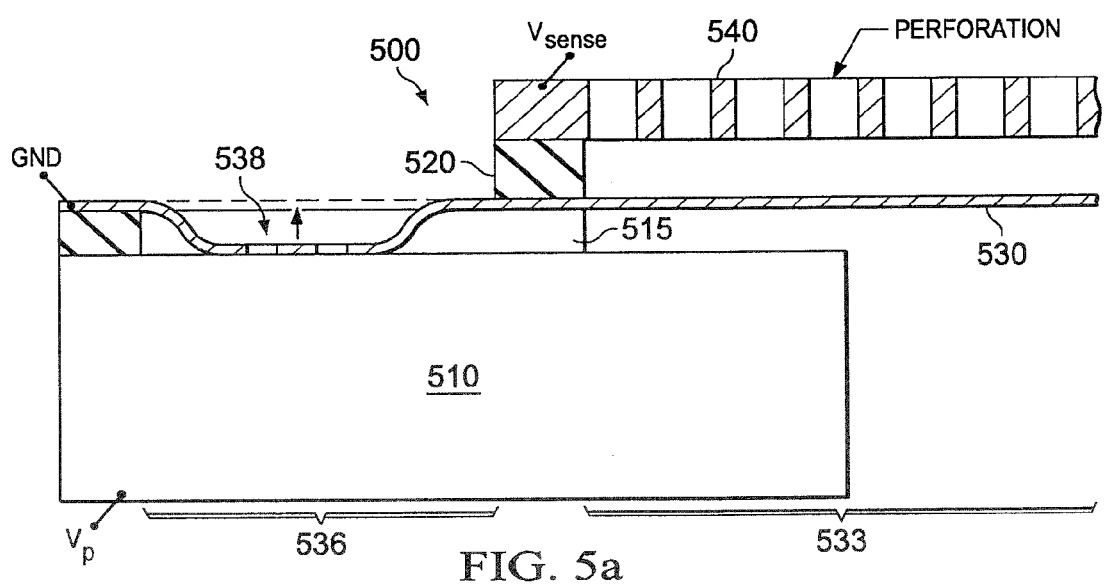
FIG. 5a shows a cross-section view of a MEMS structure.
Figure 5B:
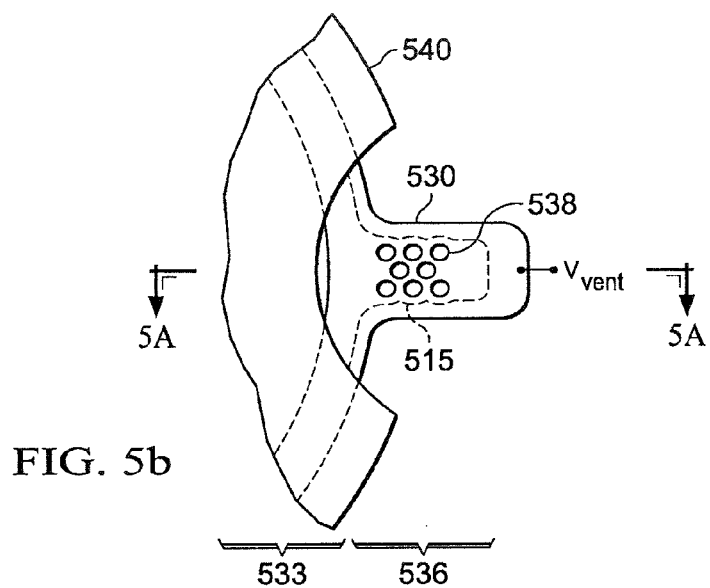

FIG. 5a shows a cross sectional view and FIG. 5b shows a top view of a MEMS structure 500 having a membrane 530 extending over a portion of a substrate 510 and outside a sensing region 533. The MEMS structure 500 may comprise a substrate 510, a connection region 520, a membrane 530 and a backplate 540 which comprise similar materials as described with respect to FIG. 4a. The membrane 530 may comprise a sensing region 533 and a tuning region 536. The sensing region 533 may be located between the opposite rims of the substrate 510 or between the opposite connection regions 520. The tuning region 536 may extend over a portion of the substrate 510 and may be located outside the sensing region 533. The sensing region 533 may be located on a first side of the connection region 520 and the tuning region 536 may be located on a second side of the connection region 520. A recess 515 (under etch) may be formed between the membrane 530 and the substrate 510 in the tuning region 536. The backplate 540 may overlie only the sensing region 533 but not the tuning region 536 of the membrane 530. The backplate 540 may be perforated. The backplate 540 may be set to a bias voltage $V_{sense}$, the substrate 510 may be set to a tuning voltage $V_p$ and the membrane may be set to ground. In this configuration of the MEMS structure 500 the tuning voltage may be independent of the sensing voltage.

The tuning region 536 of the membrane 530 may comprise at least one adjustable ventilation openings 538 which provide a ventilation path in a non-actuated position (OFF position) and which does not provide a ventilation path in an actuated position (ON position). The non-actuated or open position (OFF position) may be a position wherein the adjustable ventilation openings 538 are in the same plane as the membrane 530 in the sensing region 533 in in its resting position. The actuated or closed position (ON position) may be a position wherein the adjustable ventilation openings 538 are pressed against the substrate 510 and the ventilation path is blocked. Intermediate positions may be set by pulling the adjustable ventilation openings 538 towards the substrate 510 but where the adjustable ventilation openings 538 are not pressed against the substrate 510. It is noted that the sensing region 533 may or may not comprise adjustable ventilation openings 538.

Figure 6A:
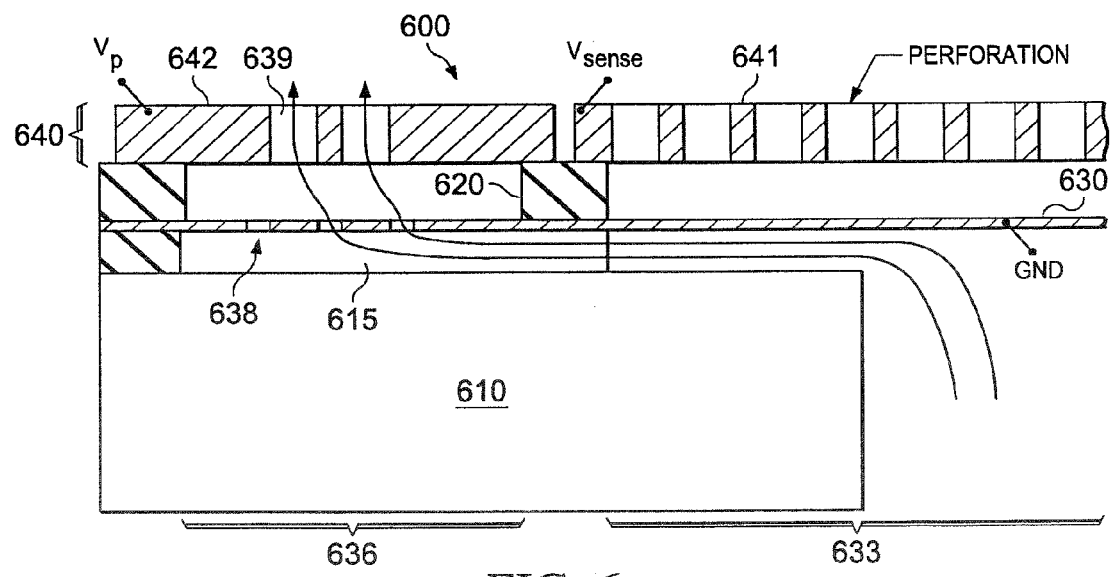
FIG. 6a shows a cross-section view of a non-actuated MEMS structure.
Figure 6B:
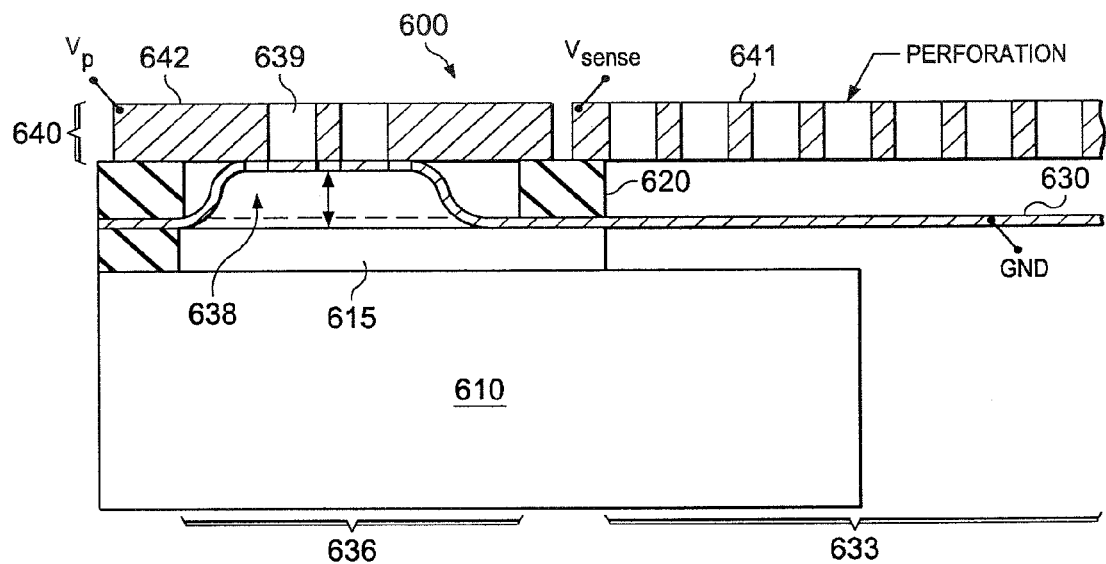
FIG. 6b shows a cross-section view of an actuated MEMS structure.

FIGS. 6a and 6b show a cross sectional view of a MEMS structure 600 having a membrane 630 extending over a portion of a substrate 610 outside a sensing region 633. The MEMS structure 600 may comprise a substrate 610, a connection region 620, a membrane 630 and a backplate 640 which may comprise similar materials as described with respect to FIG. 4a. The membrane 630 may comprise a sensing region 633 and a tuning region 636. The sensing region 633 may be located between the opposite rims of the substrate 610 or between the opposite connection regions 620. The tuning region 636 may extend over a portion of the substrate 610 and may be located outside the sensing region 633. The sensing region 633 may be located on a first side of the connection region 620 and the tuning region 636 may be located on a second side of the connection region 620. A recess 615 may be formed between the membrane 630 and the substrate 610 in the tuning region 636.

The backplate 640 may overlie the sensing region 633 and the tuning region 636 of the membrane 630. The backplate 640 may be perforated in the sensing region 633 and the tuning region. Alternatively, the backplate 640 may be perforated in the sensing region 633 but not in the tuning region 636. The backplate 640 may comprise a first electrode 641 and a second electrode 642. Alternatively, the backplate 640 may comprise more than two electrodes. The first electrode 641 may be isolated from the second electrode 642. The first electrode 641 may be disposed in the sensing region 633 and the second electrode 642 may be disposed in the tuning region 636. The first electrode 641 may be set to a bias voltage $V_{sense}$, and the second electrode 642 is set to the tuning voltage $V_p$. The membrane 630 may be set to ground. In this configuration of the MEMS structure 600 the tuning voltage may be independent of the sensing voltage.

The tuning region 636 of the membrane 630 may comprises one or more adjustable ventilation openings 638 which may provide a ventilation path in an non-actuated position (OFF position) in FIG. 6a and which does not provide a ventilation path in an actuated position (ON position) in FIG. 6b. The open position or non-actuated (OFF position) may be a position wherein the adjustable ventilation openings 638 may be in the same plane as the membrane 630 in the sensing region 633 in its resting position. The closed position or actuated position (ON position) may be a position wherein the adjustable ventilation openings 638 are pressed against the backplate 640 and the ventilation path is blocked. The MEMS structure 600 may provide a ventilation path and a high corner frequency when it is not in an actuated position (OFF position). The MEMS structure 600 may provide a closed ventilation path and a low corner frequency when it is in an actuated position (ON position). Intermediate positions may be set by pulling the adjustable ventilation openings 638 toward the backplate 640 but where the adjustable ventilation openings 638 are not pressed against the backplate 640. It is noted that the sensing region 633 may or may not comprise adjustable ventilation openings 638.

The backplate 640 may comprise ventilation openings 639 and the membrane 630 may comprise adjustable ventilation openings 638 in the tuning region 636. In one example the ventilation openings 639 and the adjustable ventilation openings 638 may be reversely aligned with respect to each other.

Figure 7A:
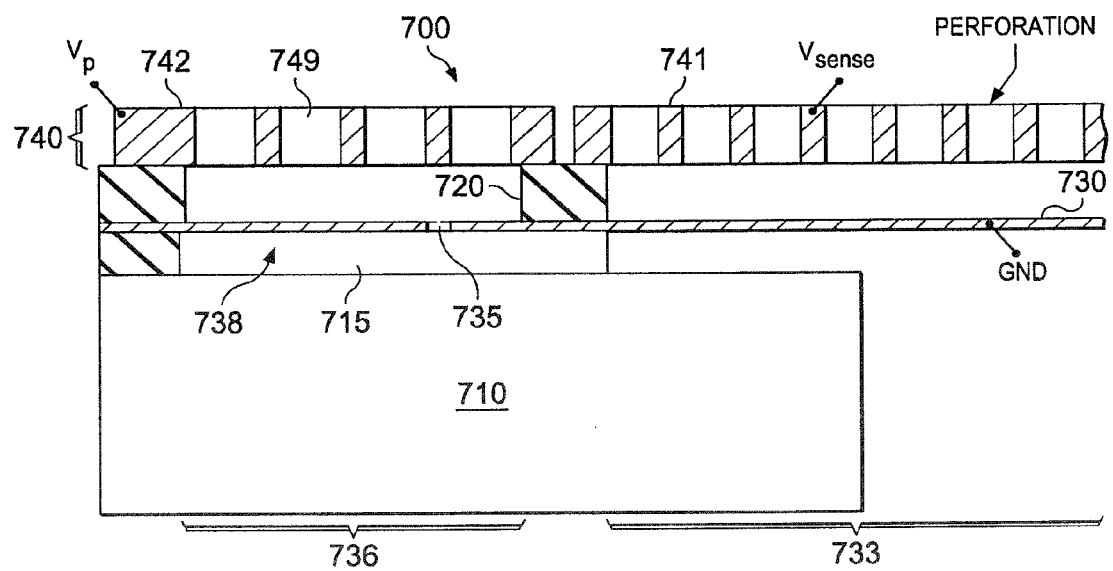
FIG. 7a shows a cross-section view of a non-actuated MEMS structure.
Figure 7B:
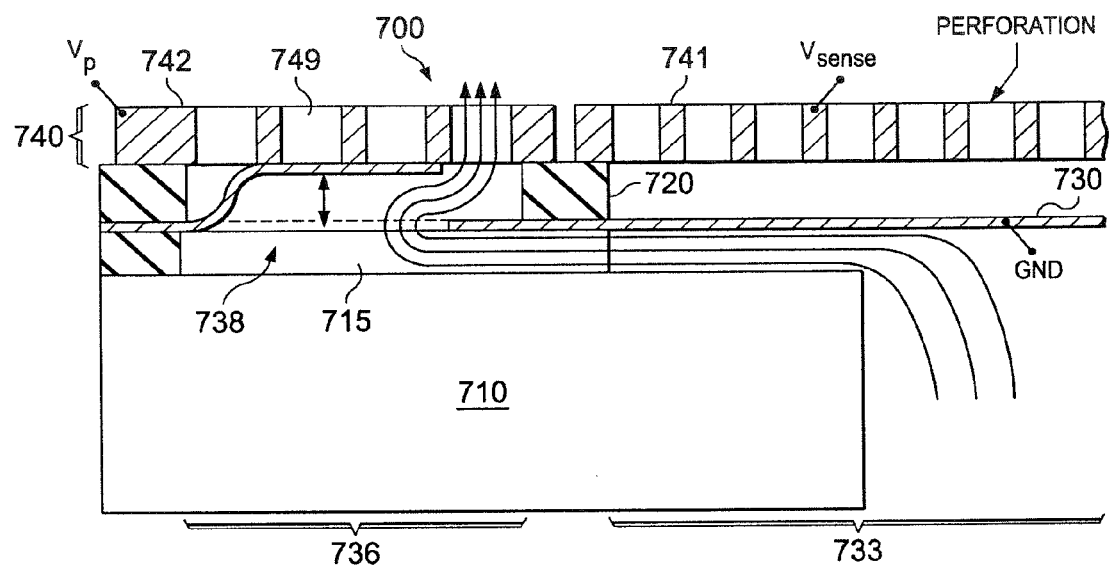
FIG. 7b shows a cross-section view of an actuated MEMS structure.
Figure 7C:
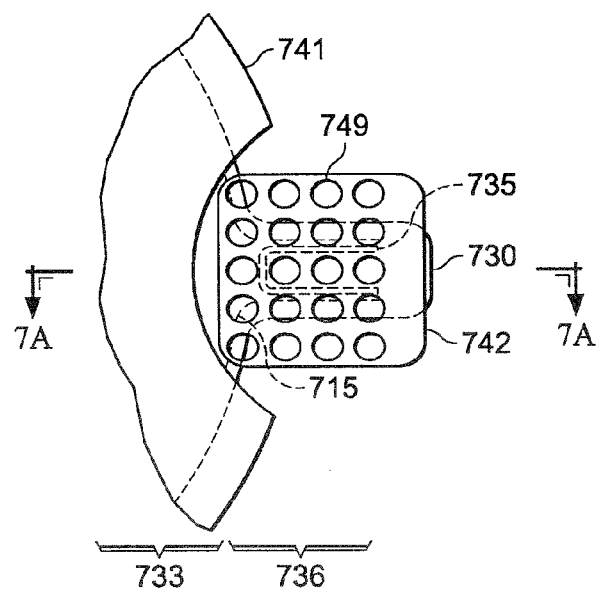

FIGS. 7a and 7b show a cross sectional view and FIG. 7c shows a top view of a MEMS structure 700 having a membrane 730 extending over a portion of a substrate 710 and outside a sensing region 733. The MEMS structure 700 may comprise a substrate 710, a connection region 720, a membrane 730 and a backplate 740 which may comprise similar materials as described with respect to FIG. 4a. The backplate 740 may comprise a sensing backplate (e.g., circular or rectangle) 741 and a backplate bridge 742.

The membrane 730 may comprise a sensing region 733 and a tuning region 736. The sensing region 733 may be located between the opposite rims of the substrate 710 or between the opposite connection regions 720. The tuning region 736 may extend over a portion of the substrate 710 and may be located outside the sensing region 733. The sensing region 733 may be located on a first side of the connection region 720 and the tuning region 736 may be located on a second side of the connection region 720. A recess 715 (under etch) may be formed between the membrane 730 and the substrate 710 in the tuning region 736. The membrane 730 may comprise an adjustable ventilation opening 738 formed by a slot 735. The slot 735 may form a movable portion as described in FIGS. 2a-2c for the adjustable ventilation opening 738.

The backplate 740 may overlie the sensing region 733 and the tuning region 736 of the membrane 730. For example, the sensing backplate 741 (first electrode) may overlie the sensing region 733 and the backplate bridge 742 (second electrode) may overlie the tuning region 736. Alternatively, the backplate 740 may comprise more than two electrodes. The first electrode 741 may be isolated from the second electrode 742. The first electrode 741 may be set to a bias voltage $V_{sense}$ and second electrode 742 may be set to a tuning voltage $V_p$. The membrane 730 may be set to ground. In this configuration of the MEMS structure 700 the tuning voltage may be independent of the sensing voltage. The backplate 740 may be perforated in the sensing region 733 and the tuning region 736. Alternatively, the backplate 740 may be perforated in the sensing region 733 but not in the tuning region 736. The backplate bridge 742 may comprise ventilation openings 749.

The tuning region 736 of the membrane 730 may comprise one or more adjustable ventilation openings 738 which may provide a ventilation path in an actuated position (ON position) in FIG. 7b and which may provide a smaller ventilation path in a non-actuated position (OFF position) in FIG. 7a. The closed or non-actuated position (OFF position) may be a position wherein the adjustable ventilation openings 738 are in the same plane as the membrane 730 in the sensing region 733 in its resting position. The open or actuated position (ON position) may be a position wherein the adjustable ventilation openings 738 are pressed against the backplate 740 and the ventilation path is open. The MEMS structure 700 may provide a ventilation path and a high corner frequency when it is in an actuated position (ON position). The MEMS structured 700 may provide a closed ventilation path and a low corner frequency when it is in non-actuated position (OFF position). Intermediate positions may be set by pulling the adjustable ventilation openings 738 toward the backplate 740 but where the adjustable ventilation openings 738 are not pressed against the backplate 740. It is noted that the sensing region 733 may or may not comprise adjustable ventilation openings 738.

Figure 8A:
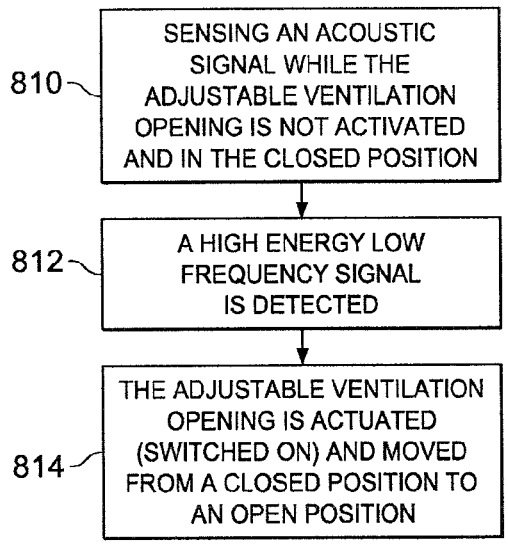
FIG. 8a shows a flow chart of an operation of a MEMS structure, wherein the adjustable ventilation opening is originally closed.

FIG. 8a shows an example of operating a MEMS structure. In a first step 810, an acoustic signal may be sensed by moving a membrane relative to a backplate. The adjustable ventilation opening may be in a closed position. In a next step 812, a high energy signal may be detected. The adjustable ventilation opening may be moved from a closed position to an open position, 814. The open position may be a completely open position or a partially open position.

Figure 8B:
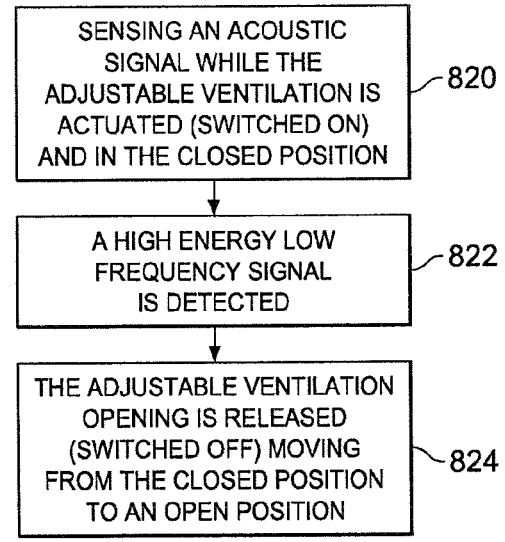
FIG. 8b shows a flow chart of an operation of a MEMS structure, wherein the adjustable ventilation opening is originally open.

FIG. 8b shows an example of operating a MEMS structure. In a first step, 820, an acoustic signal may be sensed by moving a membrane relative to a backplate. The adjustable ventilation opening may be in an actuated (ON) closed position. In a next step 822, a high energy signal may be detected. The adjustable ventilation opening may be moved from the actuated (ON) closed position to a non-actuated (OFF) open position, 824. The open position may be a completely open position or a partially open position.

Figure 8C:
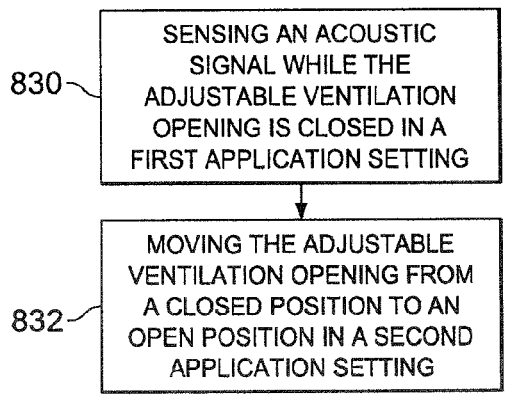
FIG. 8c shows a flow chart of an operation of a MEMS structure, wherein the adjustable ventilation opening is opened to switch from a first application setting to a second application setting.

FIG. 8c shows an example of operating a MEMS structure. In a first step, 830, the MEMS structure may be in a first application setting sensing acoustic signals by moving a membrane relative to a backplate. The adjustable ventilation opening may be in a closed position. In a second step, 832, the MEMS structure may be in a second application setting sensing acoustic signals by moving a membrane relative to the backplate. The adjustable ventilation opening may be moved from a closed position to an open position. The open position may be a completely open position or a partially open position.

Figure 8D:
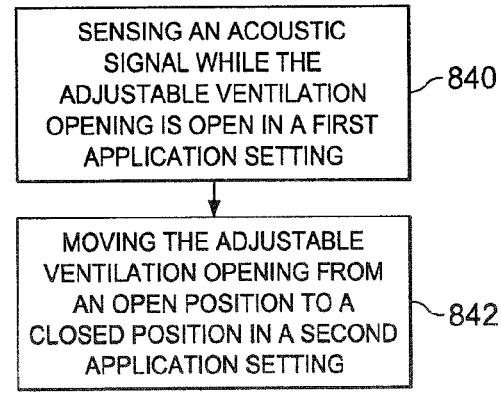
FIG. 8d shows a flow chart of an operation of a MEMS structure, wherein the adjustable ventilation opening is closed to switch from a first application setting to a second application setting.

FIG. 8*d* shows an example of operating a MEMS structure. In a first step, 840, the MEMS structure may be in a first application setting sensing acoustic signals by moving a membrane relative to a backplate. The adjustable ventilation opening may be in an open position. In a second step, 842, the MEMS structure may be in a second application setting sensing acoustic signals by moving a membrane relative to the backplate. The adjustable ventilation opening may be moved from an open position to a closed position. The closed position may be a completely closed position or a partially closed position.

A further example involves a passively actuated adjustable ventilation opening. The adjustable ventilation opening may be passive because it does not receive any control input. The adjustable ventilation opening can be mechanically actuated by the pressure difference acting on it.

Figure 9A:
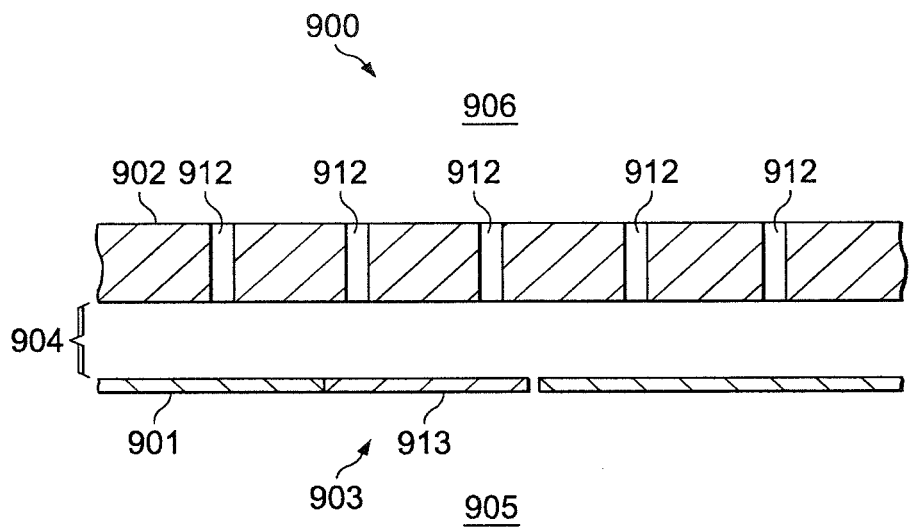
FIG. 9a shows a cross-section view of a MEMS structure with a passive adjustable ventilation opening.
Figure 9B:
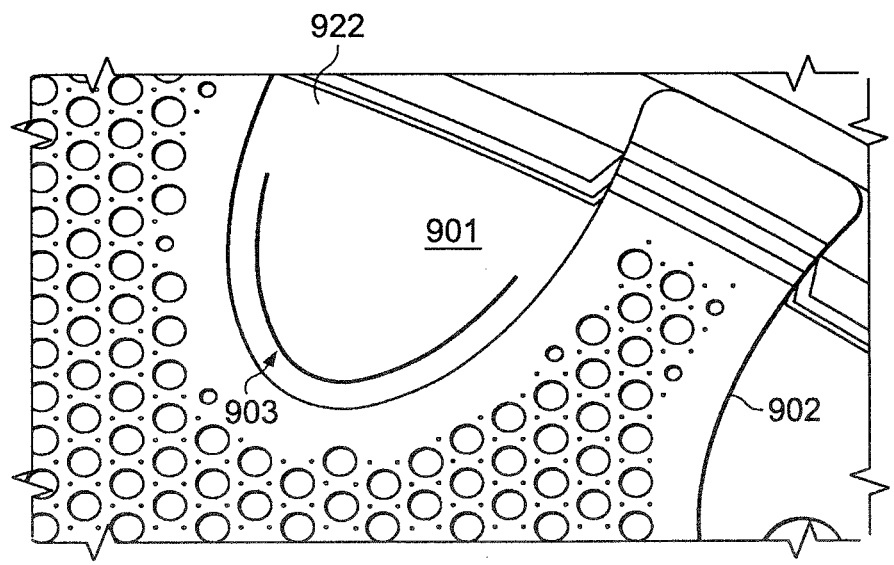
FIG. 9b shows a top view of a MEMS structure with a passive adjustable ventilation opening.

FIGS. 9*a* and 9*b* show a MEMS structure 900 with a passively actuated adjustable ventilation opening on the membrane. FIG. 9*a* shows a cross section of the MEMS structure 900, which includes a membrane 901, a backplate 902, and a ventilation opening 903. The backplate 902 may be perforated with backplate perforation holes 912. The backplate 902 and the membrane 901 may be separated by a gap distance 904. The gap distance can range from 0.5 µm and 5 µm. In one example, the gap distance is about 2 µm.

In this example, the ventilation opening 903 may be located in the membrane 901. As will be discussed below, other locations are also possible. The opening 903 is formed from a flexible structure 913 configured to deflect when acted upon by a force or pressure difference. As typical of MEMS microphones, the membrane 901 may separate a first space 905, characterized by a pressure A, from a second space 906, characterized by a pressure B.

In typical operation of a MEMS microphone the difference between pressures A and B causes the membrane to deflect. The deflection may be sensed from a changing voltage across the membrane 901 and the backplate 902, which may serve as capacitor plates. In an example, the difference between pressures A and B in spaces 905 and 906 may cause the flexible structure 913 to mechanically actuate. No input from a control mechanism is needed. The flexible structure 913 can be characterized by a mechanical stiffness, which may determine what pressure differences will cause varying levels of actuation.

Embodiments of the flexible structure 913 can have different mechanical geometries, lengths, widths, thicknesses, or materials all tailored to select values of mechanical stiffness. In addition, the geometry of the ventilation opening 903, including the length and width of the flexible structure 913 may strongly influence the amount of fluid flowing through the opening. The amount of fluid flowing through the opening may affect how quickly the pressure difference between spaces 905 and 906 can be reduced.

FIG. 9*b* shows a top view of an example of the MEMS structure 900 where the adjustable ventilation opening 903 is located below (or above) a backplate window 922. The backplate window 922 is located near an outer edge of the backplate 902 resembling the example shown in FIGS. 1*a* and 1*b*.

With respect to examples of the MEMS structure with passively actuated adjustable ventilation openings, at least two particular categories of problems can be solved. These are problems related to low frequency noise and problems related to damaging high pressure events. Fixed ventilation openings can prevent damage to a membrane, but may decrease the sensitivity of the microphone by limiting the bandwidth. The passive adjustable ventilation opening may provide higher bandwidth and protection against damaging high pressure events. The behavior of the passive adjustable ventilation opening with respect to these two classes of problems can be described in three cases.

Case 1 pertains to a low frequency signal of moderate or low pressure (e.g., up to about 120 dB SPL). As described earlier, ventilation slots with an equivalent time constant may act as high pass filters with a corner frequency. For case 1, the non-adjustable ventilation slots may provide a corner frequency above the low frequency signals. With the passive adjustable ventilation opening, the relative low pressure of the signals in case 1 will typically not cause the ventilation openings to open. Referring again to FIG. 9*a*, there will be little reduction of pressure between space 905 and space 906. The low frequency signal can be sensed with full bandwidth.

Case 2 pertains to low frequency noise. Often relatively high pressure signals at low frequencies (e.g., noise between about 120 and 140 dB SPL having frequencies below about 100 Hz) can be encountered in typical situations. Examples of this type of noise could be wind noise when driving in a convertible or low frequency music when walking past a stereo system. However, in these cases the simultaneous detection of higher frequency signals (e.g., regular speech) by a MEMS microphone may be desirable. In this case a passive adjustable ventilation opening may be self-adjusted by the low frequency high pressure noise. The high pressure difference between space 905 and 906 may cause a ventilation opening to open and reduce the pressure difference. The higher frequency lower pressure signals may still excite the membrane and allow the signal to be sensed by the MEMS microphone with a decreased signal to noise ratio.

Case 3 pertains to extreme over pressure damaging signals. This is the case when the microphone is dropped or a path to the membrane is mechanically struck causing a large pressure flux to approach and impact the membrane (e.g., when a person taps a finger on a microphone input). These extreme signals can cause the microphone to fail by causing the membrane to rupture or fracture. Fixed ventilation holes can be used to protect a microphone from extreme over pressure. However, the larger the holes (and hence the better the protection against larger shocks), the higher the corner frequency of the high pass filter caused by the ventilation holes. In this way, better protection may come at the cost of reduced bandwidth.

For the passive adjustable ventilation opening the extreme over pressure events of case 3 may cause the ventilation openings to self-actuate from the pressure difference itself and open to reduce the pressure between space 905 and space 906. As seen in case 1, the openings do not actuate for regular pressure signals. Thus the microphone may be protected from damage by extreme over pressure events, but may maintain the large bandwidth needed to sense low frequency signals. The passive adjustable ventilation openings may provide the solution to the problems seen in cases 1 through 3 without any control mechanism.

The passive ventilation opening (or openings) can be the only openings provided in the membrane. Alternatively, fixed openings (e.g., small holes) could also be included. In another alternative, an actuated opening can be included in combination with the passive opening. For example, the actuated opening can be used to tune the frequency corner while the passive opening is designed to prevent damage (e.g., case 3). It is also understood that all three types could be used in the same device.

Figure 10A:
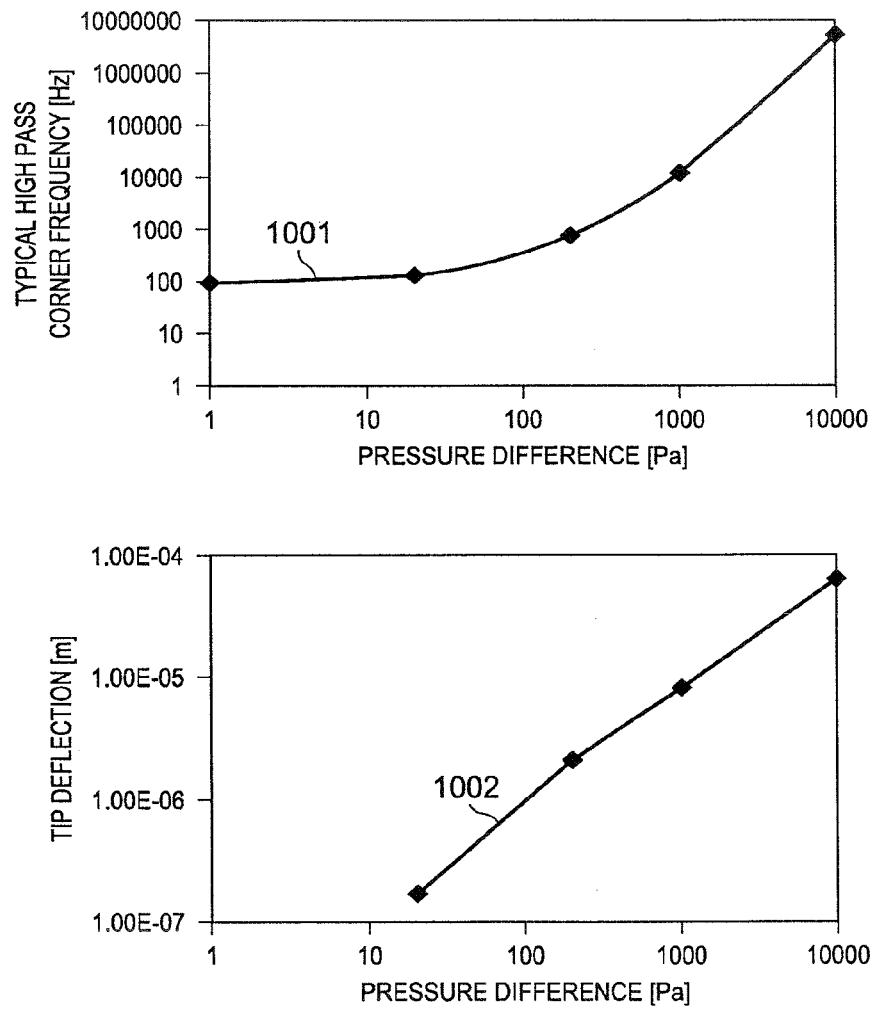
FIG. 10a shows a graph of a shifting of a corner frequency with a tip deflection of a passive adjustable ventilation opening.

FIG. 10*a* shows the mechanical response of an example of a MEMS structure or MEMS device. FIG. 10*a* shows the shifting of a corner frequency 1001 with a tip deflection 1002 of a passive adjustable ventilation opening as a pressure difference across the ventilation opening increases. The corner frequency shift was described earlier in FIG. 2e.

Figure 10B:
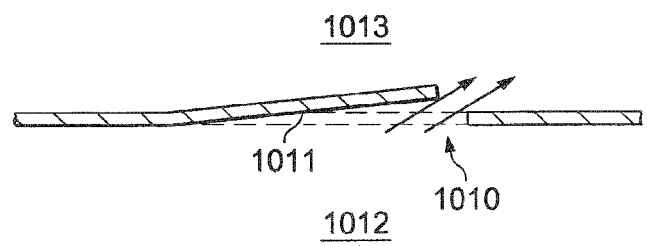
FIG. 10b shows a cross-section view of an adjustable ventilation opening comprising a cantilever located on a membrane.

FIG. 10b shows an example of a passive adjustable ventilation opening 1010 comprised of a cantilever 1011. The cantilever 1011 is shown in a deflection caused by a pressure difference between space 1012 with pressure A and space 1013 with pressure B. In the specific example of FIG. 10b, a length of the cantilever 1011 could be 70 µm and a width of cantilever 1011 could be 20 µm. In other examples, the length of the cantilever 1011 could range from 10 to 500 µm and a width of cantilever 1011 could range from 5 to 100 µm. In another example, the number of cantilevers per ventilation opening can also range from 1 to many.

Figure 11A:
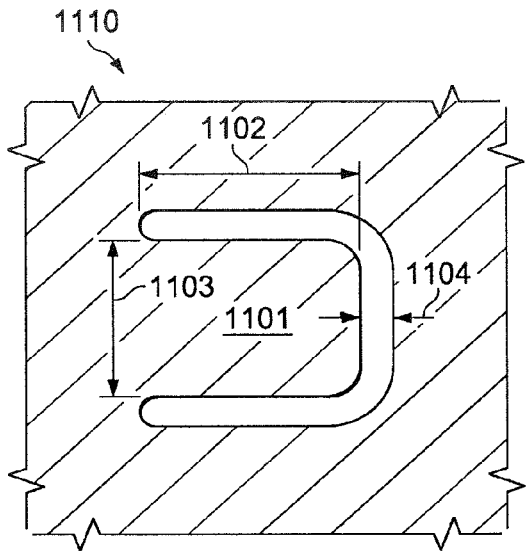

FIGS. 11a-11f show various examples of an adjustable ventilation opening. FIG. 11a shows an example of an adjustable ventilation opening 1110 comprising a square flexible structure 1101. The flexible structure 1101 may comprise a length 1102, a width 1103, and an opening gap 1104. In various examples, the ratio of the length to the width can range from about 1:1 to about 10:1. The opening gap 1104 may be typically between about 0.5 and 5 µm.

Figure 11B:
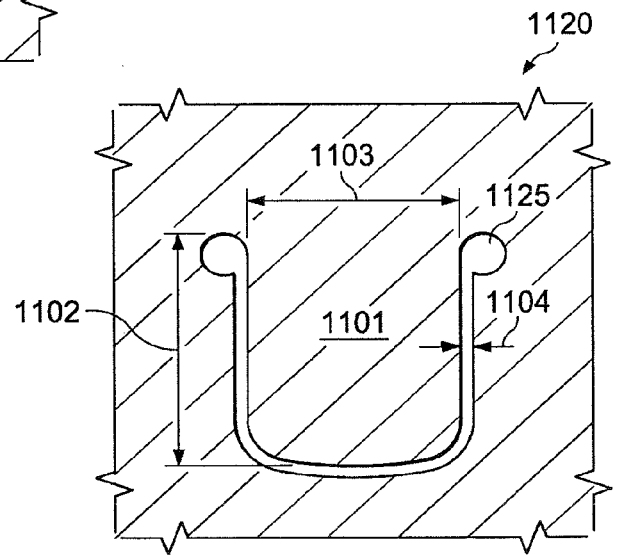

FIG. 11b shows an example of an adjustable ventilation opening 1120 with small openings 1125 at ends of an opening gap 1104. These small openings 1125 at corners of a flexible structure 1101 can serve as fixed ventilation holes or can be configured to affect the mechanical stiffness of the flexible structure 1101. In an example, the small openings 1125 may also be meant to reduce the notching stress.

Figure 11C:
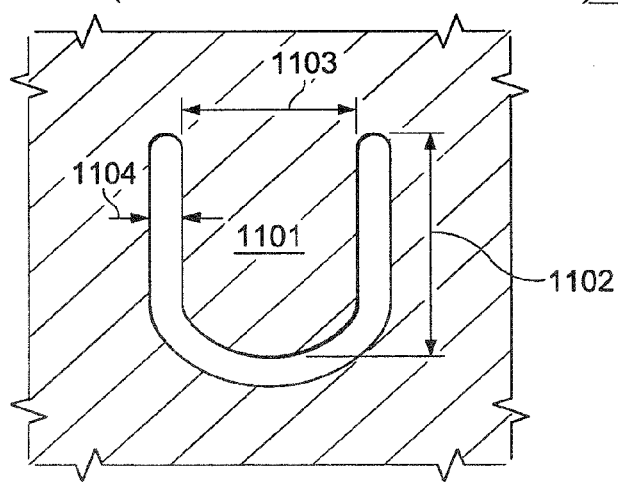

FIG. 11c shows an example of an adjustable ventilation opening 1130 with a rounded flexible structure 1101 and opening gap 1104 separating the flap 1101 from the rest of the membrane. The shape of the flexible structure 1101 may affect the air flow dynamics through the opening. The shape may alter the flow rate in the initial opening of the flexible structure (a small displacement) 1101 and in a larger opening of the flexible structure (a large displacement) 1101. Thus the shape may directly affect how quickly a pressure difference reduction can be produced. In addition to round or square shapes, any other reasonable structure may be used (e.g., triangular, saw tooth, or other polygons).

Figure 11D:
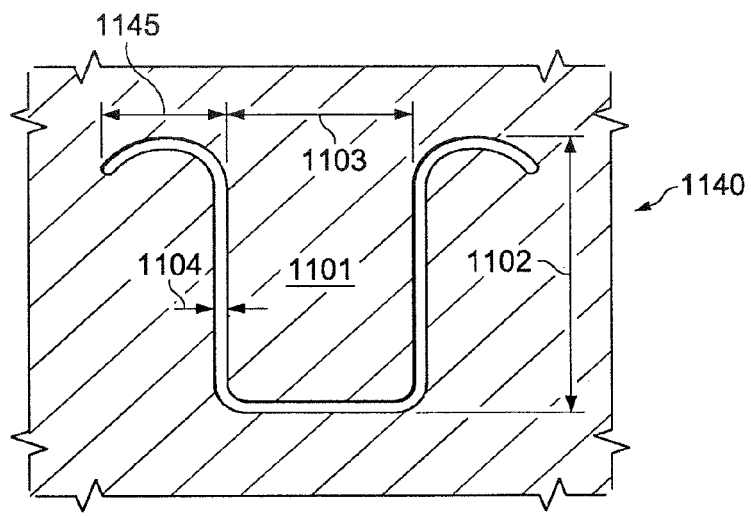

FIG. 11d shows an example of an adjustable ventilation opening with curved openings 1145 at an end of an opening gap 1104. The curved openings can serve the purpose of releasing the notching stress from the cantilever base.

Figure 11E:
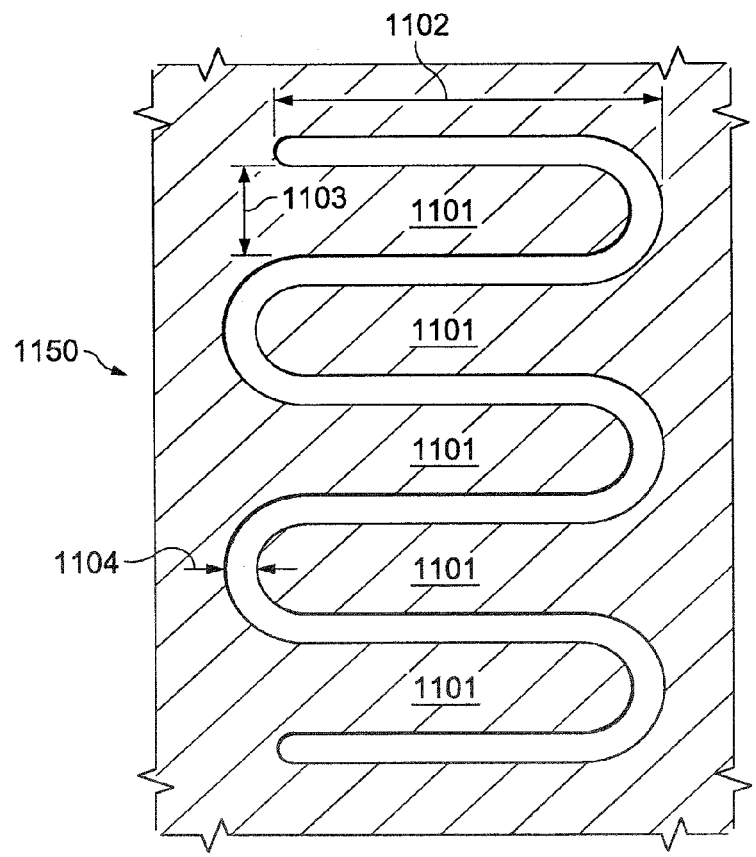

FIG. 11e shows an example of an adjustable ventilation opening 1150 with intertwining flexible structures 1101 comprising a serpentine opening gap 1104. This structure could provide increased air flow while maintaining higher mechanical stiffness of the flexible structures 1101.

FIG. 11f shows an example of an adjustable ventilation opening where two flexible structures 1101 with separate opening gaps 1104 are placed adjacent to one another. Additional slots 1105 may be included to increase ventilation and to add flexibility to the structure. The slots 1105 may reduce the stiffness of an adjustable ventilation opening 1160 and may allow the whole structure to displace further. The structures 1101 could have different sizes of opening gap 1104, or the same size. The structures 1101 could have the same or different widths 1103 or lengths 1102. The adjustable ventilation opening 1160 could comprise an entire membrane or the opening could comprise a small portion of a larger membrane. The parameters may be chosen in order to improve the function of the adjustable ventilation openings and the microphone.

The examples in FIGS. 11a-11f are meant to show that an adjustable ventilation opening can be made in many examples comprising various geometries and dimensions. One or more of these various examples could be used together. Further it should be noted that any materials in these structures can be used. In various examples an adjustable ventilation opening may comprise a corrugated surface and/or an anti-sticking mechanism, such as bumps and/or coatings.

In other examples an adjustable ventilation opening may comprise thinner or thicker materials than a structure of which the adjustable ventilation opening is a part. In order to increase (by a thicker mechanical structure) or decrease (by a thinner mechanical structure) the mechanical stiffness of an adjustable ventilation opening, the structural thickness of a flexible structure could be varied. In an example comprising an adjustable ventilation opening on a membrane, the structure may be microfabricated using techniques commonly used in the production of MEMS or microelectronics. During the fabrication process, the flexible structure may be selectively etched (for instance through the use of photoresist to protect other regions) to produce a thinner mechanical structure. Alternatively, the flexible structure may have additional materials deposited on it or the surrounding structural materials of the membrane may be etched more than the flexible structure itself. In any of these examples the structural layer thickness of the flexible structure may be effectively varied to produce different mechanical stiffness values and improved adjustable ventilation opening performance.

An example may include multiple adjustable ventilation openings. The inclusion of more than one adjustable ventilation opening may be meaningful as the corner frequency of the high pass filter may scale linearly with the number of adjustable ventilation openings. Additionally, the inclusion of multiple vents may reduce the risk of malfunction (e.g., caused by dirt impeding a single vent).

FIGS. 12 and 13a-13d show various examples with different configurations of a passive adjustable ventilation opening. Once again, the features of these various examples can be combined.

FIG. 12 shows an example with a packaged MEMS microphone 1200 in a device housing. The device housing may comprise a support structure 1202 and a lid structure 1203. The support structure 1202 can, for example, be formed from a laminate such as a printed circuit board. The support structure 1202 can include electrical contacts on an inner surface to connect to the components within the housing, e.g., MEMS 1201 and ASIC (application specific integrated circuit) 1204). These contacts can be routed through the support structure 1202 to be accessed externally.

The lid 1203 can be used to enclose the components of the device 1200. In the illustrated example, the lid 1203 may leave an air space over a backplate 1221. This air gap, which may be at the same pressure as the space right above the membrane 1211 due to the holes in the backplate 1221, may provide one of the pressures from which the pressure difference is determined. The lid 1203 can be made from metal, plastic, or laminate materials, as well as any other material appropriate for a lid structure.

A MEMS structure 1201 may be attached to the support structure 1202. As described above, the MEMS structure may comprise a membrane 1211 and a backplate 1221. A sound port 1207 may provide a path for a pressure wave (e.g., sound signal) through the support structure 1202 to the membrane 1211.

A sense electronics block 1204 may be also attached to the support structure 1202. The sense electronics block 1204 may be connected to the MEMS structure 1201. The sense electronics block 1204 may be configured to sense a changing voltage across the membrane 1211 the backplate 1221. Sound signals, incident on the membrane, cause the membrane to deflect. The resulting changes in a gap distance separating the membrane 1211 and the backplate 1221 may be reflected by the changing voltage across the two elements. The sense electronics block 1204 may process this changing voltage signal to provide an output signal containing the audio information of the incident sound wave.

In the specific example of FIG. 12, the membrane 1211 may comprise an adjustable ventilation opening 1208. The membrane 1211 may separate a space 1205 with a pressure A from a space 1206 with a pressure B. The adjustable ventilation opening 1208 in one example may be comprised of a cantilever. The adjustable ventilation opening 1208 may be mechanically actuated to deflect due to a large pressure difference A to B, or vice versa, between spaces 1205 and 1206. For pressure signals in a sense range of the MEMS structure 1201, the adjustable ventilation opening 1208 may deflect very little or none.

In various example the MEMS structure 1201 may include a substrate. In various examples the substrate may be the support structure 1202 or a separate substrate. In other examples the support structure may be a printed circuit board (PCB) or a plastic or laminate structure as part of the device housing.

In still further examples the sound port 1207 may provide access to the membrane 1211 in space 1205 opposite the side with the backplate 1221 or the sound port 1207 may provide access to the membrane 1211 in space 1206 on the same side as the backplate 1221 (e.g., through the lid structure 1203). In that specific example the space 1205 would be sealed and the sound port 1207 in the support structure 1202 would not be present.

The examples discussed thus far include the adjustable ventilation opening in the membrane. This is just one possible location. As will be described with respect to FIGS. 13a-13d, the ventilation opening can be located in other portions of the device.

FIG. 13a shows an example where an adjustable ventilation opening 1208 may be incorporated into a support structure 1202. In this case, the adjustable ventilation opening 1208 will be actuated by a pressure difference between a space 1205 and a space 1206. Although a membrane 1211 in a MEMS structure 1201 may not provide any ventilation openings, the adjustable ventilation opening 1208 in the support structure 1202 may provide a reduction of pressure needed to solve the problems of the three cases described earlier. As a part of the support structure 1202, if needed, it is possible to make the adjustable ventilation opening 1208 larger than if it was a part of the membrane 1211. The size of the hole may range from 0.1 to 1 mm and may vary in cross-sectional shape (e.g., circular, rectangular, square).

FIG. 13b shows an example with a device housing 1200 wherein an adjustable ventilation opening 1208 may be incorporated into a lid structure 1203. Similar to FIG. 13a, the adjustable ventilation opening 1208 may provide a reduction in pressure between a space 1205 and a space 1206. The adjustable ventilation opening 1208 as located in the lid structure 1203 could come in many dimensions and configurations. Locating the opening 1208 in the lid structure 1203 may provide the advantage of easy access at the top of the device housing 1200.

FIG. 13c shows an example through a cross section of a MEMS structure 1201. The MEMS structure 1201 may comprise a backplate 1221, a membrane 1211, a spacing layer 1209, and a support structure 1202. In an example an adjustable ventilation opening 1208 may be incorporated on the backplate 1221. The backplate 1221 may also comprise backplate perforation holes 1210. The membrane 1211 may separate a space 1205 with a pressure A from a space 1206 with a pressure B. The adjustable ventilation opening 1208 can provide a route for a pressure difference from A in space 1205 to B in space 1206 to be reduced if the pressure difference is large. The behavior of the passive adjustable ventilation opening 1208 may be described by the three cases explained previously. In typical sensing the passive adjustable ventilation opening 1208 may remain closed. The spacing layer 1209 may comprise any materials. In some examples the spacing layer 1209 could be silicon, oxide, polymer, or some composite. In an example the support structure 1202 may comprise a substrate. In another example the support structure 1202 may comprise a printed circuit board (PCB). In a further example the support structure 1202 may comprise a plastic or a laminate material.

Figure 13D:
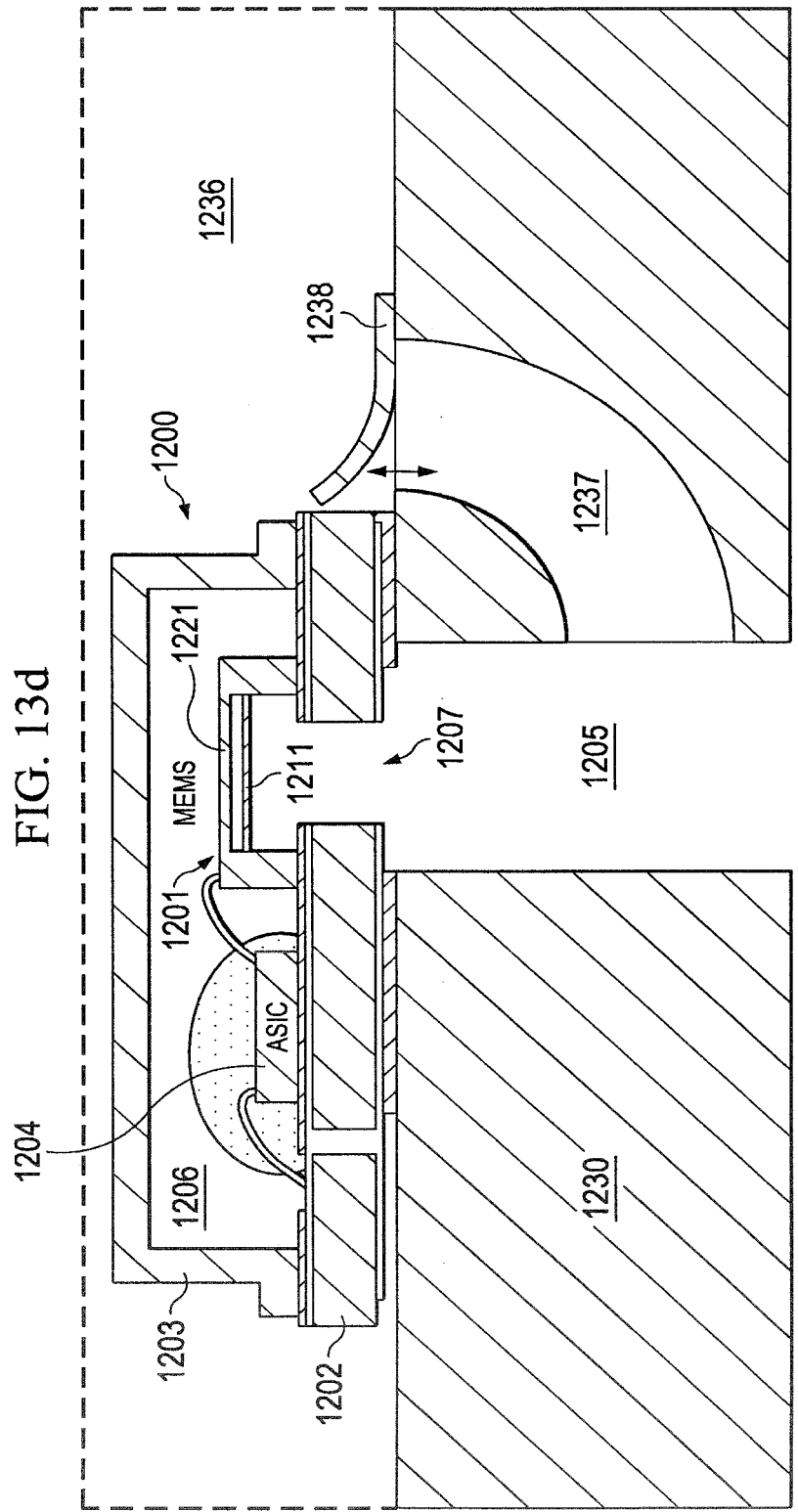
FIG. 13d shows a MEMS device comprising a housing, wherein an adjustable ventilation opening is located in the housing.

FIG. 13d shows an example comprising a housing 1230. The housing 1230 may comprise a device housing 1200, a sound port 1207, a pressure bypass port 1237, and an adjustable ventilation opening 1238. The device housing may comprise a MEMS structure 1201, a support structure 1202, a lid structure 1203, and a sense electronics block 1204. The MEMS structure 1201 may comprise a backplate 1221 and a membrane 1211. The membrane may separate a space 1205 with a pressure A from a space 1206 with a pressure B. The adjustable ventilation opening 1238 may separate the space 1205 from a space 1236 with a pressure C. A combination of the pressure bypass port 1237 and the adjustable ventilation opening 1238 may provide a route for signals entering the sound port 1207 in space 1205 with a large pressure difference between A in space 1205 and B in space 1206 or C in space 1236 to be reduced into space 1236. This example demonstrates that it is not necessary for the adjustable ventilation opening to be incorporated into the device or the MEMS structure, but can effectively function as part of the housing in various applications.

Figure 14A:
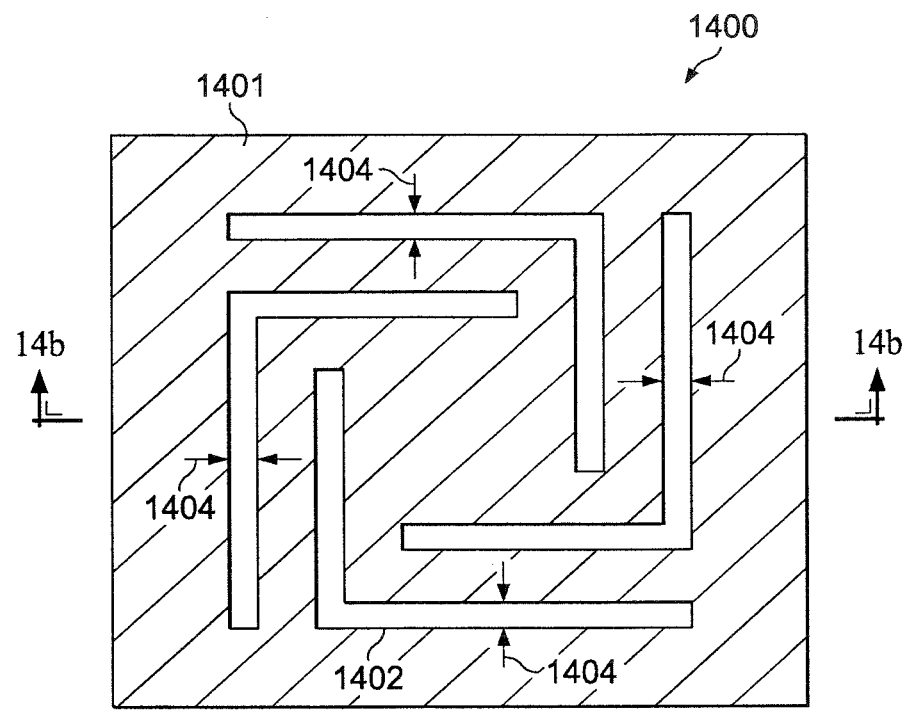
FIGS. 14a and 14b show another variant of the MEMS device.
Figure 14B:
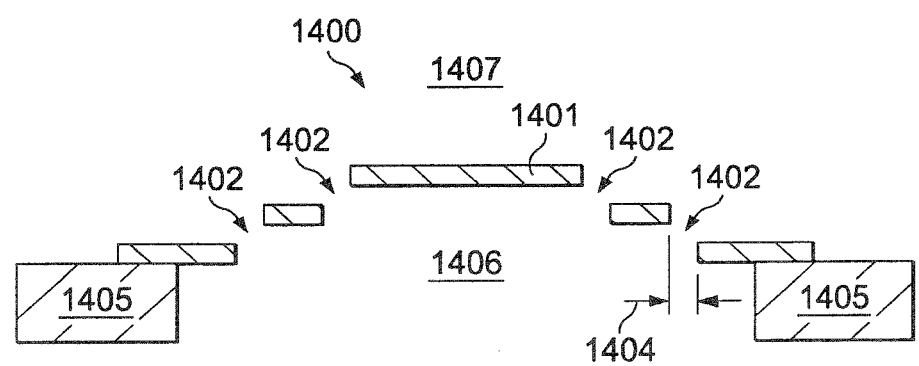

FIGS. 14a and 14b show an alternative example comprising a MEMS structure 1400. FIG. 14a shows a top view of the structure 1400 comprising a membrane 1401 supported by a spring around the circumference. The spring may be comprised of the membrane 1401 with slots 1402 removed from select portions. As illustrated, the cantilever may be surrounded by a spring-shaped gap such that at least two portions of the gap are adjacent to a region (in this case, each side) of the cantilever. While the slots are shown connected by square corners, these corners could alternatively be rounded.

FIG. 14b shows a cross-section view taken from a cross-section 14b in FIG. 14a when the vent is in an opened position. The membrane 1401 may separate the space 1406 with a pressure A from a space 1407 with a pressure B. The width of the slots 1402 may be given by an opening gap 1404. The membrane 1401 may be attached to a substrate 1405. In FIG. 14b the membrane is shown in large displacement where pressure A in space 1406 may be much greater than pressure B in space 1407. In this case of high pressure difference, the membrane 1401 may deflect further than the membrane thickness, providing greatly increased ventilation.

FIGS. 12, 13a-13d, and 14a-14b demonstrate a number of examples with the express intent of highlighting that an adjustable ventilation opening may be incorporated into any part of a MEMS structure, a device housing, a package, a substrate, or any part of the entire system. In these examples, the adjustable ventilation opening may separate a first space which is in contact with a membrane from a second space, usually in contact with an opposite side of the membrane. The second space is not, however, necessarily required to be in contact with the opposite side of the membrane.

FIG. 15 shows a schematic perspective view of a cross section of a device 1500 according to an embodiment. The device 1500 may comprise a housing support structure 1502 a MEMS structure 1201. The MEMS structure 1201 may comprise a substrate 1510 mechanically connected to the housing support structure 1502. The MEMS structure 1201 may be mechanically connected to the housing support structure 1502 in an indirect manner, e.g., via interposed elements or layers. The MEMS structure 1201 may further comprise a membrane 1211 mechanically connected to the substrate 1510, in a direct manner or in an indirect manner via interposed elements and/or material layers. The membrane 1211 may separate a first space 1205 contacting a first side of the membrane 1211 and a second space 1206 contacting an opposite second side of the membrane 1211. The device 1500 may further comprise a sound port 1207 acoustically coupled to the membrane 1211 at the first side of the membrane, the sound port 1207 being formed in the housing support structure 1502 and the substrate 1510. The device 1500 may also comprise a ventilation path 1537, 1538 through the housing support structure 1502 extending from the sound port 1207 to the second space 1206.

In a microphone system, the membrane may need to be protected against overpressure which may arise in sudden shock events caused by, for example, a drop. A very robust membrane might be suboptimal with respect to sensitivity and manufacturability. As an alternative, a ventilation by flaps in the membrane or by constructive protecting means in the application as examples, might be envisages. The constructive protecting means could be an introduction of a gasket and damping materials in the sound port. According to the embodiment of FIG. 15 and possibly of at least one of the subsequent Figures, it may be proposed that the ventilation may be constructed in the housing of a bottom port microphone. A ventilation path may be defined in a base PCB plate of the housing directing from the sound port (front volume or "first space") towards the inner volume (back volume or "second space"). It may be desired that this ventilation path is only opened in the event of overpressure. To this end, a valve element may be introduced into the ventilation path. This valve or valve element can comprise, e.g., a rubber sheet, a polymeric film, a piece of flex substrate, etc., such that it may open under pressures in excess of, e.g., 200 Pa. The valve element may be flexible to come into a rest position if normal acoustic pressures enter the transducer. In other words, a valved ventilation path may be provided from the sound port to the back volume.

Typically, the ventilation path 1537, 1538 in the housing support structure 1502 can be manufactured relatively easily and at low cost. Since the ventilation path connects the sound port 1207 with the second space 1206, which contacts the membrane 1211 at the opposite side, an overpressure within the sound port 1207 can be discharged directly into said second space so that the overpressure within the sound port 1207 may not only be reduced (as is the case with the embodiments according to FIG. 13*d*, for example), but at the same time the pressure within the second space 1206 may be increased. As a result, the membrane 1211 may be typically better and/or faster protected against suddenly occurring overpressure events at the sound port 1207. After the overpressure event at the sound port 1207 has ended, an overpressure typically may remain in the second space 1206 which can be slowly discharged to the sound port 1207 by a ventilation hole 140 (FIG. 1*b*) configured to provide static pressure equalization. In the alternative, static pressure equalization may occur through the ventilation path 1537, 1538, 1637, 1737. In case the ventilation path is a valved ventilation path, the adjustable ventilation opening 1208 may permit a small amount of air or fluid to flow from the second space 1206 towards the sound port 1207.

The device 1500 may further comprise an adjustable ventilation opening 1208 configured to reduce a pressure difference between the sound port 1207 and the second space 1206, wherein the adjustable ventilation opening 1208 may be passively actuated as a function of the pressure difference between the first space 1205 and the second space 1206.

The adjustable ventilation opening 1208 may comprise a resilient flap attached to a surface of the housing support structure 1502, said surface contacting the second space 1206.

The adjustable ventilation opening 1208 may comprise at least one of a rubber sheet, a polymeric film, a piece of flexible substrate material, and a resilient metal sheet. In addition, or in the alternative, the adjustable ventilation opening 1208 may comprise a cantilever.

The ventilation path 1537, 1538 may be a valved ventilation path that is configured to open in response to an overpressure at the sound port 1207 with respect to the second space 1206 and otherwise to assume a closed rest position.

For the embodiment shown in FIG. 15, the housing support structure 1502 may comprise three layers 1532, 1534, and 1536. The ventilation path 1537, 1538 may comprise an elongated cutout 1537 in the middle layer 1534 which may extend laterally from the sound port 1207 to a lateral position that is not beneath the substrate 1510. The ventilation path may further comprise a hole 1538 in the upper layer 1532 of the housing support structure 1502 at said lateral position. The hole 1538 may be temporarily closed by the adjustable ventilation opening 1208. When the adjustable ventilation opening 1208 may be temporarily open (e.g., due overpressure in the sound port 1207 relative to the second space 1206), the hole 1538 may open to the second space 1206.

The ASIC 1204 and/or the MEMS structure may be electrically contacted by contact pads 1592, 1594, 1956 formed at a bottom surface of the housing support structure 1502. Electrical connections 1593 through the housing support structure 1502 may also be provided. Furthermore, the ASIC 1204 may be electrically connected to the MEMS structure 1201 by a bond wire or a similar electrical connection.

The housing support structure 1502 may comprise at least two layers. At least a first layer thereof is structured to laterally define the ventilation path and at least a second layer thereof limits the ventilation path in a normal direction with respect to a planar extension of the at least two layers.

Figure 16:
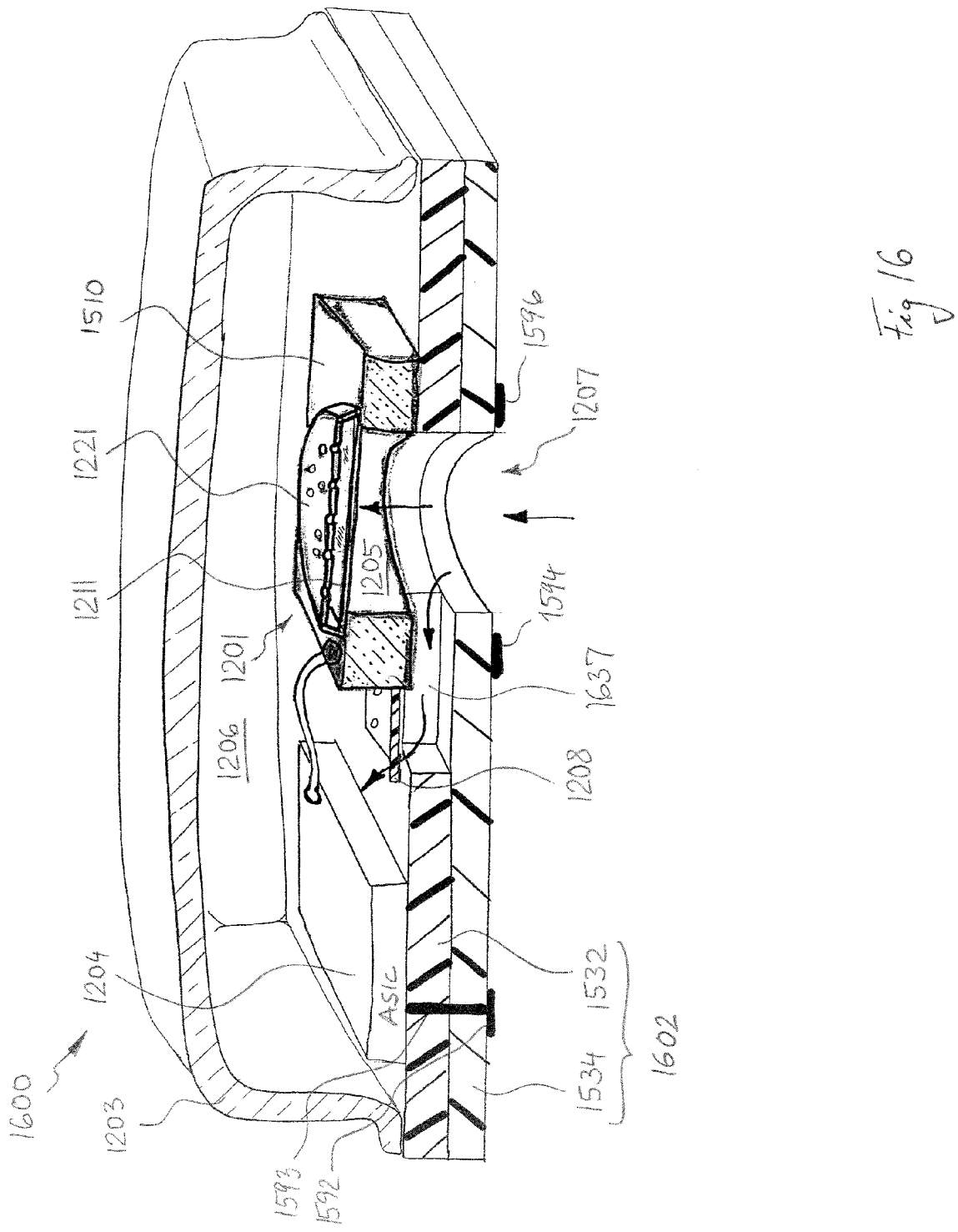
FIG. 16 shows another embodiment of the present invention similar to the embodiment of FIG. 15, wherein the support structure has two layers and wherein one side of the ventilation path is delimited by the substrate of the MEMS structure.

FIGS. 16 and 17 show schematic perspective views of cross sections according to further embodiments. The device 1600 according to the embodiment shown in FIG. 16 may comprise a housing support structure 1602 having two layers 1532 and 1534. The ventilation path may be formed as an elongated cutout 1637 in the upper layer 1532. The elongated cutout 1637 may be partially covered by the substrate 1510 of the MEMS structure 1201. The adjustable ventilation opening 1208 may be adjacent to the substrate 1510.

According to FIG. 17, the housing support structure 1702 may comprise a single layer and the ventilation path may be formed by a recess 1737 in the single layer of the housing support structure 1702. The recess 1737 may be partially covered by the substrate 1510 of the MEMS structure 1201.

The housing support structure 1502, 1602, 1702 may comprise at least one of a recess and a channel extending in lateral direction from the sound port 1207 to a position outside a footprint of the substrate 1510 where it may open to a surface of the housing support structure 1502, 1602, 1702, said surface contacting the second space 1206.

FIG. 18 shows a schematic perspective view of a cross section according to a further embodiment. The device 1800 according to the embodiment in FIG. 18 may comprise a housing support structure 1802. The sound port 1207 may be formed by a first opening in the housing support structure 1802 and may continue within the substrate 1510 until it coincides with the first space 1205. The ventilation path 1837 may be formed by a second opening in the housing support structure 1802, the second opening 1837 being adjacent to the first opening 1207. The first opening 1207 and the second opening 1837 may both extend between a first surface of the support structure and an opposite second surface of the support structure. The first surface may correspond to the planar surface of the housing support structure 1802 that is depicted in FIG. 18 as the lower surface which is in contact with an application level structure 1830. The second surface of the housing support structure 1802 may be the surface that is mostly adjacent to the second space 1206, except for where it is covered by the substrate 1510 or the ASIC 1204 or possible other components that are mounted to said second surface.

An overpressure that may occur at the sound port 1207 may be effectively discharged via the ventilation path 1837. The overpressure may first flow along a portion of the bottom surface of the housing support structure 1802, said portion extending between the sound port 1207 and the opening 1837 that may be part of the ventilation path. Then the overpressure may flow along the opening 1837, may open the adjustable ventilation opening (flap) 1208 and may be released into the second space 1206. As in the embodiments according to FIGS. 15 to 17, the ventilation path in FIG. 18 may go through the housing support structure 1802 and may extend from the sound port 1207 to the second space 1206.

The sound port 1207 and the ventilation path 1837 may both extend from a common surface region 1889 within the first surface of the housing support structure 1802 that may correspond to a sound hole 1882 formed within an application layer structure 1830. The application layer structure 1830 may be, for example, the printed circuit board (PCB) of a mobile phone, or the housing, or the PCB plus the housing of a mobile phone, of a smart phone, of a tablet computer, of a digital camera, or another electronic device. The device 1800 may be typically provided to, e.g., a mobile phone manufacturer as a vendor part to be integrated into the mobile phone etc. by the mobile phone manufacturer.

According to an alternative embodiment, the sound port 1207 and the ventilation path 1837 may extend from the common surface region within the first surface of the housing support structure 1802 that may be delimited by a sealing 1894, a solder ring, a solder ring having sealing properties, or a similar element.

The device and/or the MEMS structure may be a bottom port sound transducer.

The device may further comprise a housing 1203 mechanically connected to the housing support structure 1502, 1602, 1702, 1802 and enclosing the second space 1206.

The ventilation path 1537, 1538, 1637, 1737, 1837 may end at a position of a surface of the housing support structure 1502, 1602, 1702, said position being laterally displaced from the substrate 1510.

According to further embodiments, a device 1500, 1600, 1700, 1800, according to the present invention, may comprise a housing support structure 1502, 1602, 1702, 1802, and a membrane 1211 mechanically connected to the support structure. The membrane 1211 may separate a first space 1205 contacting a first side of the membrane and a second space 1206 contacting an opposite second side of the membrane 1211. The device 1500, 1600, 1700 may further comprise a sound port 1207 acoustically coupled to the membrane 1211 at the first side of the membrane, the sound port 1270 being formed in the support structure. The device may also comprise an adjustable ventilation opening 1208 acoustically coupled to the sound port 1207 and formed at a surface of the housing support structure 1502, 1602, 1702, the adjustable ventilation opening 1208 being configured to reduce a pressure difference between the sound port and the second space, wherein the adjustable ventilation opening 1208 may be actuated as a function of the pressure difference between the sound port 1207 and the second space 1206.

The adjustable ventilation opening 1208 may comprise a cantilever that is substantially flush with the surface of the housing support structure 1502, 1602, 1702 while being in a rest position and wherein a tip of the cantilever may be configured to deflect away from the surface of the support structure in response to an overpressure within the sound port 1207 relative to the second space 1206.

The device may further comprise a ventilation path 1537, 1538, 1637, 1737, 1837 formed in the housing support structure 1502, 1602, 1702, 1802, the ventilation path extending from the sound port 1207 to the adjustable ventilation opening 1208.

The support structure may comprise at least two layers 1532, 1534, 1536, at least a first layer thereof being structured to laterally define the ventilation path 1537, 1538, 1637, 1737 from the sound port 1207 to the second space 1206 and at least a second layer of the at least two layers limiting the ventilation path in a normal or orthogonal direction with respect to a planar extension of the at least two layers 1532, 1534, 1536.

The device may further comprise a backplate 1221 spaced a gap distance from the membrane 1211.

Further embodiments provide a device comprising: a MEMS structure 1201 that may comprise a substrate 1510 and a membrane 1211 that is mechanically connected to the substrate 1510. The membrane 1211 may separate a first space 1205 contacting a first side of the membrane from a second space 1206 contacting an opposite second side of the membrane. The device may further comprise a housing 1203 enclosing the MEMS structure 1201 and a sound port 1207 formed in the housing 1207, the sound port 1207 being acoustically coupled to the first space 1205. The device may also comprise a ventilation path 1537, 1538, 1637, 1737, 1837 through the housing 1203 extending from the sound port 1207 to the second space 1206.

The device may further comprise an adjustable ventilation opening 1208 within the ventilation path 1537, 1538, 1637, 1737, 1837 or adjacent thereto, wherein the adjustable ventilation opening may be passively actuated as a function of a pressure difference between the sound port 1207 and the second space 1206.

The adjustable ventilation opening 1208 may comprise a cantilever.

The housing 1203 may comprise a lid and a support structure, the MEMS structure 1201 being mechanically connected to the housing support structure 1502, 1602, 1702, 1802 wherein the support structure may comprise the sound port 1207 and the ventilation path 1537, 1538, 1637, 1737, 1837.

The housing 1203 may comprise, e.g., a printed circuit board as the housing support structure 1502 and the sound port 1207 and the ventilation path 1537, 1538, 1637, 1737 may be formed in the printed circuited board.

As one skilled in the art will recognize, an adjustable ventilation opening will often comprise a plurality of adjustable ventilation openings for better performance in the three cases previously described. Thus, specific embodiments of the invention will include a plurality of adjustable ventilation openings included in any of the structures described previously or in any combinations of the structures described previously (e.g., membranes, backplates, substrates, support structures, lid structures, housing, packaging, etc.).

Although the present invention and its advantages have been described in detail, it should be understood that various changes, substitutions and alterations can be made herein without departing from the spirit and scope of the invention as defined by the appended claims.

What is claimed is:

1. A device comprising:
   a support structure;
   a sound port disposed in the support structure;
   a MEMS structure including a membrane acoustically coupled to the sound port, the membrane separating a first space contacting a first side of the membrane from a second space contacting an opposite second side of the membrane; and
   an adjustable ventilation path disposed in the support structure and extending from the sound port to the second space,
   wherein the adjustable ventilation path comprises an adjustable ventilation opening comprising a valve element, wherein the valve element is not formed by or on the membrane.

2. The device according to claim 1, wherein the adjustable ventilation opening is configured to reduce a pressure difference between the sound port and the second space, wherein the adjustable ventilation opening is actuated as a function of the pressure difference between the first space and the second space.

3. The device according to claim 1, wherein the ventilation path is a valved ventilation path that is configured to open in response to an overpressure at the sound port with respect to the second space.

4. The device according to claim 1, wherein the support structure comprises at least one of a recess and a channel extending in lateral direction from the sound port to a position outside a footprint of the MEMS structure where it opens to a surface of the support structure contacting the second space.

5. The device according to claim 1, wherein the support structure comprises at least two layers, at least a first layer thereof being structured to laterally define the ventilation path and at least a second layer thereof limiting the ventilation path in a normal direction with respect to a planar extension of the at least two layers.

6. The device according to claim 1, wherein the device is a bottom port sound transducer.

7. The device according to claim 1, further comprising a housing mechanically connected to the support structure and enclosing the second space.

8. The device according to claim 1, wherein the ventilation path ends at a position of a surface of the support structure, said position being laterally displaced from the MEMS structure.

9. The device according to claim 1, wherein the sound port comprises a first opening in the support structure and wherein the ventilation path comprises a second opening in the support structure adjacent to the first opening, wherein the first opening and the second opening both extend between a first surface of the support structure and an opposite second surface of the support structure.

10. The device according to claim 2, wherein the valve element comprises a flap attached to a surface of the support structure, said surface contacting the second space.

11. The device according to claim 2, wherein the valve element comprises at least one of a rubber sheet, a polymeric film, a piece of flexible substrate material, and a resilient metal sheet.

12. The device according to claim 2, wherein the valve element comprises a cantilever.

13. The device according to claim 9, wherein the sound port and the ventilation path both extend from a sound hole formed within an application layer structure adjacent to the first surface of the support structure.

14. The device according to claim 9, further comprising at least one of a sealing, a solder ring, and a solder ring having sealing properties at the first surface of the support structure.

15. The device according to claim 14, wherein at least one of the sealing, the solder ring, a the solder ring having sealing properties encompasses the first opening and the second opening.

16. A device comprising:
   a support structure;
   a membrane separating a first space contacting a first side of the membrane and a second space contacting an opposite second side of the membrane;
   a sound port acoustically coupled to the membrane at the first side of the membrane, the sound port being formed in the support structure; and
   an adjustable ventilation opening acoustically coupled to the sound port and formed at a surface of the support structure, the adjustable ventilation opening being configured to reduce a pressure difference between the sound port and the second space, wherein the adjustable ventilation opening is actuated as a function of the pressure difference between the sound port and the second space, wherein the adjustable ventilation opening comprises a valve element, wherein the valve element is not formed by or on the membrane.

17. The device according to claim 16, wherein the valve element comprises a cantilever that is flush with the surface of the support structure while being in a rest position and wherein a tip of the cantilever is configured to deflect away from the surface of the support structure in response to an overpressure within the sound port relative to the second space.

18. The device according to claim 16, further comprising a ventilation path formed in the support structure, the ventilation path extending from the sound port to the adjustable ventilation opening.

19. The device according to claim 16, wherein the support structure comprises at least two layers, at least a first layer thereof being structured to laterally define a ventilation path from the sound port to the second space and at least a second layer of the at least two layers limiting the ventilation path in a normal direction with respect to a planar extension of the at least two layers.

20. A device comprising:
   a MEMS structure comprising a membrane separating a first space contacting a first side of the membrane from a second space contacting an opposite second side of the membrane;
   a housing enclosing the MEMS structure;
   a sound port formed in the housing, the sound port being acoustically coupled to the first space; and
   a ventilation path through the housing extending from the sound port to the second space,
   wherein the ventilation path comprises an adjustable ventilation opening comprising a valve element, wherein the valve element is not formed by or on the membrane.

21. The device according to claim 20, wherein the adjustable ventilation opening is actuated as a function of a pressure difference between the sound port and the second space.

22. The device according to claim 20, wherein the housing comprises a lid and a support structure, the MEMS structure being mechanically connected to the support structure, wherein the support structure comprises the sound port and the ventilation path.

23. The device according to claim 20, wherein the housing comprises a printed circuit board and wherein the sound port and the ventilation path are formed in the printed circuited board.

24. The device according to claim 20, wherein the sound port comprises a first opening in the housing and wherein the ventilation path comprises a second opening in the housing adjacent to the first opening, wherein the first opening and the second opening both extend between a first surface of the housing and an opposite second surface of the housing.

25. The device according to claim 21, wherein the valve element comprises a cantilever.

26. The device according to claim 24, wherein the sound port and the ventilation path extend from a common surface region within the first surface of the housing that is delimited by at least one of a sealing, a solder ring, and a solder ring having sealing properties.

* * * * *